(12) United States Patent
Zhang et al.

(10) Patent No.: US 10,062,578 B2
(45) Date of Patent: Aug. 28, 2018

(54) METHODS FOR ETCH OF METAL AND METAL-OXIDE FILMS

(71) Applicant: Applied Materials, Inc., Santa Clara, CA (US)

(72) Inventors: Jingchun Zhang, Milpitas, CA (US); Anchuan Wang, San Jose, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/746,670

(22) Filed: Jun. 22, 2015

(65) Prior Publication Data

US 2015/0318186 A1   Nov. 5, 2015

Related U.S. Application Data

(63) Continuation of application No. 13/416,223, filed on Mar. 9, 2012, now Pat. No. 9,064,815.

(Continued)

(51) Int. Cl.
*B44C 1/22* (2006.01)
*C03C 15/00* (2006.01)
(Continued)

(52) U.S. Cl.
CPC .. *H01L 21/31116* (2013.01); *H01J 37/32422* (2013.01); *H01L 21/31122* (2013.01); *H01L 21/32136* (2013.01)

(58) Field of Classification Search
CPC ................... H01L 21/31122; H01L 21/32136
(Continued)

(56) References Cited

U.S. PATENT DOCUMENTS

| 2,369,620 A | 2/1945 | Sullivan et al. |
| 3,401,302 A | 9/1968 | Thorpe |

(Continued)

FOREIGN PATENT DOCUMENTS

| CN | 1124364 A | 2/1996 |
| CN | 1847450 A | 10/2006 |

(Continued)

OTHER PUBLICATIONS

Office Action dated Jan. 20, 2016 in Chinese Patent Application No. 201280013237.2, all pages.

(Continued)

*Primary Examiner* — Thomas Pham
(74) *Attorney, Agent, or Firm* — Kilpatrick Townsend & Stockton LLP

(57) ABSTRACT

A method of selectively etching a metal-containing film from a substrate comprising a metal-containing layer and a silicon oxide layer includes flowing a fluorine-containing gas into a plasma generation region of a substrate processing chamber, and applying energy to the fluorine-containing gas to generate a plasma in the plasma generation region. The plasma comprises fluorine radicals and fluorine ions. The method also includes filtering the plasma to provide a reactive gas having a higher concentration of fluorine radicals than fluorine ions, and flowing the reactive gas into a gas reaction region of the substrate processing chamber. The method also includes exposing the substrate to the reactive gas in the gas reaction region of the substrate processing chamber. The reactive gas etches the metal-containing layer at a higher etch rate than the reactive gas etches the silicon oxide layer.

20 Claims, 12 Drawing Sheets

Related U.S. Application Data

(60) Provisional application No. 61/452,522, filed on Mar. 14, 2011.

(51) Int. Cl.

| | | |
|---|---|---|
| *C03C 25/68* | (2006.01) | |
| *C23F 1/00* | (2006.01) | |
| *H01L 21/306* | (2006.01) | |
| *H01L 21/311* | (2006.01) | |
| *H01J 37/32* | (2006.01) | |
| *H01L 21/3213* | (2006.01) | |

(58) Field of Classification Search
USPC .......................................................... 438/720
See application file for complete search history.

(56) References Cited

U.S. PATENT DOCUMENTS

| | | |
|---|---|---|
| 3,451,840 A | 6/1969 | Hough |
| 3,537,474 A | 11/1970 | Rohrer |
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,364,803 A | 12/1982 | Nidola et al. |
| 4,368,223 A | 1/1983 | Kobayashi et al. |
| 4,374,698 A | 2/1983 | Sanders et al. |
| 4,381,441 A | 4/1983 | Desmarais et al. |
| 4,397,812 A | 8/1983 | Mallory, Jr. |
| 4,468,413 A | 8/1984 | Bachmann |
| 4,565,601 A | 1/1986 | Kakehi et al. |
| 4,579,618 A | 4/1986 | Celestino et al. |
| 4,585,920 A | 4/1986 | Hoog et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,838,990 A | 6/1989 | Jucha et al. |
| 4,851,370 A | 7/1989 | Doklan et al. |
| 4,857,140 A | 8/1989 | Loewenstein |
| 4,865,685 A | 9/1989 | Palmour |
| 4,868,071 A | 9/1989 | Walsh et al. |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,904,621 A | 2/1990 | Lowenstein et al. |
| 4,913,929 A | 4/1990 | Moslehi et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,203,911 A | 4/1993 | Sricharoenchalkit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,275,977 A | 1/1994 | Otsubo et al. |
| 5,277,750 A | 1/1994 | Wolgang |
| 5,279,669 A | 1/1994 | Lee |
| 5,279,865 A | 1/1994 | Chebi et al. |
| 5,288,518 A | 2/1994 | Homma |
| 5,290,382 A * | 3/1994 | Zarowin ........... H01J 37/32357 118/723 ER |
| 5,292,370 A | 3/1994 | Tsai et al. |
| 5,292,682 A | 3/1994 | Stevens et al. |
| 5,300,463 A | 4/1994 | Cathey et al. |
| 5,302,233 A | 4/1994 | Kim et al. |
| 5,304,250 A | 4/1994 | Sameshima et al. |
| 5,306,530 A | 4/1994 | Strongin et al. |
| 5,314,724 A | 5/1994 | Tsukune et al. |
| 5,319,247 A | 6/1994 | Matsuura |
| 5,326,427 A | 7/1994 | Jerbic |
| 5,328,218 A | 7/1994 | Lowrey et al. |
| 5,328,558 A | 7/1994 | Kawamura et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,368,897 A | 11/1994 | Kurihara et al. |
| 5,378,316 A | 1/1995 | Franke et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |

(56) References Cited

U.S. PATENT DOCUMENTS

| | | |
|---|---|---|
| 5,464,499 A | 11/1995 | Moslehi |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,534,070 A | 6/1996 | Okamura et al. |
| 5,536,360 A | 6/1996 | Nguyen et al. |
| 5,531,835 A | 7/1996 | Fodor et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,575,853 A | 11/1996 | Arami et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,592,358 A | 1/1997 | Shamouilian |
| 5,599,740 A | 2/1997 | Jang et al. |
| 5,614,055 A | 3/1997 | Fairbairn et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,660,957 A | 8/1997 | Chou et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,788,825 A | 8/1998 | Park et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,835,334 A | 11/1998 | McMillin et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,863,376 A | 1/1999 | Wicker |
| 5,865,896 A | 2/1999 | Nowak |
| 5,866,483 A | 2/1999 | Shiau et al. |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,913,978 A | 6/1999 | Kato et al. |
| 5,915,190 A | 6/1999 | Pirkle |
| 5,918,116 A | 6/1999 | Chittipeddi |
| 5,919,332 A | 7/1999 | Koshiishi et al. |
| 5,920,792 A | 7/1999 | Lin |
| 5,926,737 A | 7/1999 | Ameen et al. |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 5,997,962 A | 12/1999 | Ogasawara et al. |
| 6,004,884 A | 12/1999 | Abraham |
| 6,007,635 A | 12/1999 | Mahawill |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,036,878 A | 3/2000 | Collins et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,147 A | 6/2000 | Koshiishi |

(56) References Cited

U.S. PATENT DOCUMENTS

| | | |
|---|---|---|
| 6,072,227 A | 6/2000 | Yau et al. |
| 6,074,512 A | 6/2000 | Collins et al. |
| 6,077,384 A | 6/2000 | Collins et al. |
| 6,077,780 A | 6/2000 | Dubin |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,120,640 A | 9/2000 | Shih et al. |
| 6,136,163 A | 10/2000 | Cheung et al. |
| 6,136,165 A | 10/2000 | Moslehi et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,161,576 A | 12/2000 | Maher et al. |
| 6,162,302 A | 12/2000 | Raghavan et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,450 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,184,121 B1 | 2/2001 | Buchwalter et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,198,616 B1 | 3/2001 | Dahimene et al. |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,303,044 B1 | 10/2001 | Koemtzopoulos |
| 6,303,418 B1 | 10/2001 | Cha et al. |
| 6,306,772 B1 | 10/2001 | Lin |
| 6,308,776 B1 | 10/2001 | Sloan |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,416,874 B1 | 7/2002 | Cox et al. |
| 6,423,284 B1 | 7/2002 | Arno |
| 6,427,623 B2 | 8/2002 | Ko |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,465,051 B1 | 10/2002 | Sahin et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |

(56) References Cited

U.S. PATENT DOCUMENTS

| | | |
|---|---|---|
| 6,528,751 B1 | 3/2003 | Hoffman et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,663,715 B1 | 12/2003 | Yuda et al. |
| 6,677,242 B1 | 1/2004 | Liu et al. |
| 6,679,981 B1 | 1/2004 | Pan et al. |
| 6,688,375 B1 | 2/2004 | Turner |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fisher |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,821,571 B2 | 11/2004 | Huang |
| 6,823,589 B2 | 11/2004 | White et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,853,533 B2 | 2/2005 | Parkhe et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 | 7/2005 | Rozenzon et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,052,553 B1 | 5/2006 | Shih et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,291,360 B2 | 11/2007 | Hanawa et al. |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 | 4/2008 | Maki et al. |
| 7,364,956 B2 | 4/2008 | Saito |
| 7,365,016 B2 | 4/2008 | Ouellet et al. |
| 7,396,480 B2 | 7/2008 | Kao et al. |
| 7,396,773 B1 | 7/2008 | Blosse et al. |
| 7,416,989 B1 | 8/2008 | Liu et al. |
| 7,465,358 B2 | 12/2008 | Weidman et al. |
| 7,465,953 B1 | 12/2008 | Koh et al. |
| 7,468,319 B2 | 12/2008 | Lee |
| 7,484,473 B2 | 2/2009 | Keller et al. |
| 7,488,688 B2 | 2/2009 | Seung-Pil et al. |
| 7,494,545 B2 | 2/2009 | Lam et al. |
| 7,500,445 B2 | 3/2009 | Zhao et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,658,799 B2 | 2/2010 | Ishikawa et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |

(56) References Cited

U.S. PATENT DOCUMENTS

| | | | |
|---|---|---|---|
| 7,723,221 | B2 | 5/2010 | Hayashi |
| 7,749,326 | B2 | 7/2010 | Kim et al. |
| 7,785,672 | B2 | 8/2010 | Choi et al. |
| 7,790,634 | B2 | 9/2010 | Munro et al. |
| 7,806,077 | B2 | 10/2010 | Lee et al. |
| 7,806,078 | B2 | 10/2010 | Yoshida |
| 7,807,578 | B2 | 10/2010 | Bencher et al. |
| 7,825,038 | B2 | 11/2010 | Ingle et al. |
| 7,837,828 | B2 | 11/2010 | Ikeda et al. |
| 7,845,309 | B2 | 12/2010 | Condrashoff et al. |
| 7,867,926 | B2 | 1/2011 | Satoh et al. |
| 7,915,139 | B1 | 3/2011 | Lang et al. |
| 7,922,863 | B2 | 4/2011 | Ripley |
| 7,932,181 | B2 | 4/2011 | Singh et al. |
| 7,976,631 | B2 | 4/2011 | Burrows |
| 7,939,422 | B2 | 5/2011 | Ingle et al. |
| 7,968,441 | B2 | 6/2011 | Xu |
| 7,981,806 | B2 | 7/2011 | Jung |
| 7,989,365 | B2 | 8/2011 | Park et al. |
| 8,008,166 | B2 | 8/2011 | Sanchez et al. |
| 8,048,811 | B2 | 11/2011 | Feustel et al. |
| 8,058,179 | B1 | 11/2011 | Draeger et al. |
| 8,071,482 | B2 | 12/2011 | Kawada |
| 8,074,599 | B2 | 12/2011 | Choi et al. |
| 8,076,198 | B2 | 12/2011 | Lee et al. |
| 8,083,853 | B2 | 12/2011 | Choi et al. |
| 8,114,245 | B2 | 2/2012 | Ohmi et al. |
| 8,119,530 | B2 | 2/2012 | Hori et al. |
| 8,133,349 | B1 | 3/2012 | Panagopoulos |
| 8,173,228 | B2 | 5/2012 | Choi et al. |
| 8,183,134 | B2 | 5/2012 | Wu |
| 8,187,486 | B1 | 5/2012 | Liu et al. |
| 8,211,808 | B2 | 7/2012 | Sapre et al. |
| 8,216,486 | B2 | 7/2012 | Dhindsa |
| 8,252,194 | B2 | 8/2012 | Kiehlbauch et al. |
| 8,272,346 | B2 | 9/2012 | Bettencourt et al. |
| 8,295,089 | B2 | 10/2012 | Jeong et al. |
| 8,298,627 | B2 | 10/2012 | Minami et al. |
| 8,309,440 | B2 | 11/2012 | Sanchez et al. |
| 8,312,839 | B2 | 11/2012 | Baek |
| 8,313,610 | B2 | 11/2012 | Dhindsa |
| 8,328,939 | B2 | 12/2012 | Choi et al. |
| 8,336,188 | B2 | 12/2012 | Monteen |
| 8,357,435 | B2 | 1/2013 | Lubomirsky |
| 8,368,308 | B2 | 2/2013 | Banna et al. |
| 8,390,980 | B2 | 3/2013 | Sansoni et al. |
| 8,427,067 | B2 | 4/2013 | Espiau et al. |
| 8,435,902 | B2 | 5/2013 | Tang et al. |
| 8,440,523 | B1 | 5/2013 | Guillorn et al. |
| 8,475,674 | B2 | 7/2013 | Thadani et al. |
| 8,480,850 | B2 | 7/2013 | Tyler et al. |
| 8,491,805 | B2 | 7/2013 | Kushibiki et al. |
| 8,501,629 | B2 | 8/2013 | Tang et al. |
| 8,506,713 | B2 | 8/2013 | Takagi |
| 8,512,509 | B2 | 8/2013 | Bera et al. |
| 8,528,889 | B2 | 9/2013 | Sansoni et al. |
| 8,540,844 | B2 | 9/2013 | Hudson et al. |
| 8,551,891 | B2 | 10/2013 | Liang |
| 8,573,152 | B2 | 11/2013 | De La Llera |
| 8,622,021 | B2 | 1/2014 | Taylor et al. |
| 8,623,148 | B2 | 1/2014 | Mitchell et al. |
| 8,623,471 | B2 | 1/2014 | Tyler et al. |
| 8,642,481 | B2 | 2/2014 | Wang et al. |
| 8,652,298 | B2 | 2/2014 | Dhindsa et al. |
| 8,679,982 | B2 | 3/2014 | Wang et al. |
| 8,679,983 | B2 | 3/2014 | Wang et al. |
| 8,691,023 | B2 | 4/2014 | Bao et al. |
| 8,702,902 | B2 | 4/2014 | Blom et al. |
| 8,741,778 | B2 | 6/2014 | Yang et al. |
| 8,747,680 | B1 | 6/2014 | Deshpande |
| 8,748,322 | B1 | 6/2014 | Fung et al. |
| 8,765,574 | B2 | 7/2014 | Zhang et al. |
| 8,771,536 | B2 | 7/2014 | Zhang et al. |
| 8,771,539 | B2 | 7/2014 | Zhang et al. |
| 8,772,888 | B2 | 7/2014 | Jung et al. |
| 8,778,079 | B2 | 7/2014 | Begarney et al. |
| 8,801,952 | B1 | 8/2014 | Wang et al. |
| 8,802,572 | B2 | 8/2014 | Nemani et al. |
| 8,808,563 | B2 | 8/2014 | Wang et al. |
| 8,846,163 | B2 | 9/2014 | Kao et al. |
| 8,869,742 | B2 | 10/2014 | Dhindsa |
| 8,871,651 | B2 | 10/2014 | Choi et al. |
| 8,888,087 | B2 | 11/2014 | Okabe et al. |
| 8,895,449 | B1 | 11/2014 | Zhu et al. |
| 8,900,364 | B2 | 12/2014 | Wright |
| 8,921,234 | B2 | 12/2014 | Liu et al. |
| 8,927,390 | B2 | 1/2015 | Sapre et al. |
| 8,951,429 | B1 | 2/2015 | Liu et al. |
| 8,956,980 | B1 | 2/2015 | Chen et al. |
| 8,969,212 | B2 | 3/2015 | Ren et al. |
| 8,970,114 | B2 | 3/2015 | Busche et al. |
| 8,980,005 | B2 | 3/2015 | Carlson et al. |
| 8,980,758 | B1 | 3/2015 | Ling et al. |
| 8,980,763 | B2 | 3/2015 | Wang et al. |
| 8,992,733 | B2 | 3/2015 | Sorensen et al. |
| 8,999,656 | B2 | 4/2015 | Zhang et al. |
| 8,999,839 | B2 | 4/2015 | Su et al. |
| 8,999,856 | B2 | 4/2015 | Zhang |
| 9,012,302 | B2 | 4/2015 | Sapre et al. |
| 9,017,481 | B1 | 4/2015 | Pettinger et al. |
| 9,023,732 | B2 | 5/2015 | Wang et al. |
| 9,023,734 | B2 | 5/2015 | Chen et al. |
| 9,034,770 | B2 | 5/2015 | Park et al. |
| 9,040,422 | B2 | 5/2015 | Wang et al. |
| 9,064,815 | B2 | 6/2015 | Zhang et al. |
| 9,064,816 | B2 | 6/2015 | Kim et al. |
| 9,072,158 | B2 | 6/2015 | Ikeda et al. |
| 9,093,371 | B2 | 7/2015 | Wang et al. |
| 9,093,390 | B2 | 7/2015 | Wang et al. |
| 9,111,877 | B2 | 8/2015 | Chen et al. |
| 9,111,907 | B2 | 8/2015 | Kamineni |
| 9,114,438 | B2 | 8/2015 | Hoinkis et al. |
| 9,117,855 | B2 | 8/2015 | Cho et al. |
| 9,132,436 | B2 | 9/2015 | Liang et al. |
| 9,136,273 | B1 | 9/2015 | Purayath et al. |
| 9,144,147 | B2 | 9/2015 | Yang et al. |
| 9,153,442 | B2 | 10/2015 | Wang et al. |
| 9,159,606 | B1 | 10/2015 | Purayath et al. |
| 9,165,783 | B2 | 10/2015 | Nemani et al. |
| 9,165,786 | B1 | 10/2015 | Purayath et al. |
| 9,184,055 | B2 | 11/2015 | Wang et al. |
| 9,190,293 | B2 | 11/2015 | Wang et al. |
| 9,190,302 | B2 | 11/2015 | Ni |
| 9,209,012 | B2 | 12/2015 | Chen et al. |
| 9,236,265 | B2 | 1/2016 | Korolik et al. |
| 9,236,266 | B2 | 1/2016 | Zhang et al. |
| 9,240,315 | B1 | 1/2016 | Hsieh et al. |
| 9,245,762 | B2 | 1/2016 | Zhang et al. |
| 9,263,278 | B2 | 2/2016 | Purayath et al. |
| 9,269,590 | B2 | 2/2016 | Luere et al. |
| 9,275,834 | B1 | 3/2016 | Park et al. |
| 9,287,095 | B2 | 3/2016 | Nguyen et al. |
| 9,287,134 | B2 | 3/2016 | Wang et al. |
| 9,293,568 | B2 | 3/2016 | Ko |
| 9,299,537 | B2 | 3/2016 | Kobayashi et al. |
| 9,299,538 | B2 | 3/2016 | Kobayashi et al. |
| 9,299,575 | B2 | 3/2016 | Park et al. |
| 9,299,582 | B2 | 3/2016 | Ingle et al. |
| 9,299,583 | B1 | 3/2016 | Wang et al. |
| 9,309,598 | B2 | 4/2016 | Wang et al. |
| 9,324,576 | B2 | 4/2016 | Zhang et al. |
| 9,343,272 | B1 | 5/2016 | Pandit et al. |
| 9,343,327 | B2 | 5/2016 | Zhang et al. |
| 9,349,605 | B1 | 5/2016 | Xu et al. |
| 9,355,856 | B2 | 5/2016 | Wang et al. |
| 9,355,862 | B2 | 5/2016 | Pandit et al. |
| 9,355,863 | B2 | 5/2016 | Chen et al. |
| 9,355,922 | B2 | 5/2016 | Park et al. |
| 9,362,130 | B2 | 6/2016 | Ingle et al. |
| 9,368,364 | B2 | 6/2016 | Park et al. |
| 9,373,517 | B2 | 6/2016 | Yang et al. |
| 9,373,522 | B1 | 6/2016 | Wang et al. |
| 9,378,969 | B2 | 6/2016 | Hsu et al. |
| 9,378,978 | B2 | 6/2016 | Purayath et al. |

(56) References Cited

U.S. PATENT DOCUMENTS

| | | |
|---|---|---|
| 9,384,997 B2 | 7/2016 | Ren et al. |
| 9,385,028 B2 | 7/2016 | Nemani et al. |
| 9,390,937 B2 | 7/2016 | Chen et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,418,858 B2 | 8/2016 | Wang et al. |
| 9,425,058 B2 | 8/2016 | Kim et al. |
| 9,431,268 B2 | 8/2016 | Lill et al. |
| 9,437,451 B2 | 9/2016 | Chen et al. |
| 9,443,749 B2 | 9/2016 | Smith |
| 9,449,845 B2 | 9/2016 | Liu et al. |
| 9,449,846 B2 | 9/2016 | Liu et al. |
| 9,449,850 B2 | 9/2016 | Wang et al. |
| 9,466,469 B2 | 10/2016 | Khaja |
| 9,472,412 B2 | 10/2016 | Zhang et al. |
| 9,472,417 B2 | 10/2016 | Ingle et al. |
| 9,478,432 B2 | 10/2016 | Chen et al. |
| 9,478,434 B2 | 10/2016 | Wang et al. |
| 9,493,879 B2 | 11/2016 | Hoinkis et al. |
| 9,496,167 B2 | 11/2016 | Purayath et al. |
| 9,499,898 B2 | 11/2016 | Nguyen et al. |
| 9,502,258 B2 | 11/2016 | Xue et al. |
| 9,508,529 B2 | 11/2016 | Valcore et al. |
| 9,520,303 B2 | 12/2016 | Wang et al. |
| 9,543,163 B2 | 1/2017 | Ling et al. |
| 9,564,296 B2 | 2/2017 | Kobayashi et al. |
| 9,564,338 B1 | 2/2017 | Zhang et al. |
| 9,576,809 B2 | 2/2017 | Korolik et al. |
| 9,607,856 B2 | 3/2017 | Wang et al. |
| 9,613,822 B2 | 4/2017 | Chen et al. |
| 9,659,753 B2 | 5/2017 | Cho et al. |
| 9,659,792 B2 | 5/2017 | Wang et al. |
| 9,691,645 B2 | 6/2017 | Ayers |
| 9,704,723 B2 | 7/2017 | Wang et al. |
| 9,711,366 B2 | 7/2017 | Ingle et al. |
| 9,721,789 B1 | 8/2017 | Yang et al. |
| 9,728,437 B2 | 8/2017 | Tran et al. |
| 9,741,593 B2 | 8/2017 | Benjaminson et al. |
| 9,754,800 B2 | 9/2017 | Zhang et al. |
| 9,768,034 B1 | 9/2017 | Xu et al. |
| 9,773,648 B2 | 9/2017 | Cho et al. |
| 9,773,695 B2 | 9/2017 | Purayath et al. |
| 2001/0006093 A1 | 7/2001 | Tabuchi |
| 2001/0008803 A1 | 7/2001 | Takamatsu et al. |
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1 | 11/2001 | Thompson |
| 2001/0039921 A1 | 11/2001 | Rolfson et al. |
| 2001/0041444 A1 | 11/2001 | Shields et al. |
| 2001/0042512 A1 | 11/2001 | Xu et al. |
| 2001/0047760 A1 | 12/2001 | Moslehi |
| 2001/0053585 A1 | 12/2001 | Kikuchi et al. |
| 2001/0053610 A1 | 12/2001 | Athavale et al. |
| 2001/0054381 A1 | 12/2001 | Umotoy et al. |
| 2001/0055842 A1 | 12/2001 | Uh et al. |
| 2002/0000202 A1 | 1/2002 | Yuda et al. |
| 2002/0001778 A1 | 1/2002 | Latchford et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0023899 A1 | 2/2002 | Khater et al. |
| 2002/0028582 A1 | 3/2002 | Naltan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi et al. |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0054962 A1 | 5/2002 | Huang |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0177322 A1 | 11/2002 | Li et al. |
| 2002/0179248 A1 | 12/2002 | Kabansky et al. |
| 2002/0182878 A1 | 12/2002 | Hirose et al. |
| 2002/0187280 A1 | 12/2002 | Johnson et al. |
| 2002/0187655 A1 | 12/2002 | Tan et al. |
| 2003/0003757 A1 | 1/2003 | Nallan et al. |
| 2003/0007910 A1 | 1/2003 | Lazarovich et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087488 A1 | 5/2003 | Fink |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe et al. |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |

(56) References Cited

U.S. PATENT DOCUMENTS

| | | |
|---|---|---|
| 2003/0200929 A1 | 10/2003 | Otsuki |
| 2003/0205329 A1 | 11/2003 | Gujer et al. |
| 2003/0209323 A1 | 11/2003 | Yokogaki |
| 2003/0215963 A1 | 11/2003 | Amrhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0005726 A1 | 1/2004 | Huang |
| 2004/0018304 A1 | 1/2004 | Chung et al. |
| 2004/0020801 A1 | 2/2004 | Solling |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura et al. |
| 2004/0099285 A1 | 5/2004 | Wang et al. |
| 2004/0099378 A1 | 5/2004 | Kim et al. |
| 2004/0101667 A1 | 5/2004 | O'Loughlin et al. |
| 2004/0107908 A1 | 6/2004 | Collins et al. |
| 2004/0108067 A1 | 6/2004 | Fischione et al. |
| 2004/0108068 A1 | 6/2004 | Senzaki et al. |
| 2004/0115876 A1 | 6/2004 | Goundar et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144490 A1 | 7/2004 | Zhao et al. |
| 2004/0147126 A1 | 7/2004 | Yamashita et al. |
| 2004/0149394 A1 | 8/2004 | Doan et al. |
| 2004/0152342 A1 | 8/2004 | Li et al. |
| 2004/0154535 A1 | 8/2004 | Chen et al. |
| 2004/0157444 A1 | 8/2004 | Chiu |
| 2004/0161921 A1 | 8/2004 | Ryu |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson |
| 2004/0192032 A1 | 9/2004 | Ohmori et al. |
| 2004/0194799 A1 | 10/2004 | Kim et al. |
| 2004/0200499 A1 | 10/2004 | Harvey |
| 2004/0211357 A1 | 10/2004 | Gadgil et al. |
| 2004/0219737 A1 | 11/2004 | Quon |
| 2004/0219789 A1 | 11/2004 | Wood et al. |
| 2004/0231706 A1 | 11/2004 | Bhatnagar et al. |
| 2004/0263827 A1 | 12/2004 | Xu et al. |
| 2005/0000432 A1 | 1/2005 | Keller et al. |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0039679 A1 | 2/2005 | Kleshock |
| 2005/0051094 A1 | 3/2005 | Schaepkens et al. |
| 2005/0073051 A1 | 4/2005 | Yamamoto et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0105991 A1 | 5/2005 | Hofmeister et al. |
| 2005/0112876 A1 | 5/2005 | Wu |
| 2005/0112901 A1 | 5/2005 | Ji et al. |
| 2005/0136188 A1 | 6/2005 | Chang |
| 2005/0145341 A1 | 7/2005 | Suzuki |
| 2005/0164479 A1 | 7/2005 | Perng et al. |
| 2005/0167394 A1 | 8/2005 | Liu et al. |
| 2005/0176258 A1 | 8/2005 | Hirose et al. |
| 2005/0181588 A1 | 8/2005 | Kim |
| 2005/0183666 A1 | 8/2005 | Tsuji et al. |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0214477 A1 | 9/2005 | Hanawa et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0251990 A1 | 11/2005 | Choi et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0287755 A1 | 12/2005 | Bachmann et al. |
| 2005/0287771 A1 | 12/2005 | Seamons et al. |
| 2006/0000802 A1* | 1/2006 | Kumar ............. H01J 37/32357 216/67 |
| 2006/0000805 A1* | 1/2006 | Todorow ................. C23F 4/00 216/68 |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1 | 2/2006 | Armour et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell et al. |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0060942 A1 | 3/2006 | Minixhofer et al. |
| 2006/0065629 A1 | 3/2006 | Chen et al. |
| 2006/0087644 A1 | 4/2006 | McMillin et al. |
| 2006/0093756 A1 | 5/2006 | Rajagopalan et al. |
| 2006/0097397 A1 | 5/2006 | Russell |
| 2006/0102076 A1 | 5/2006 | Smith et al. |
| 2006/0102587 A1 | 5/2006 | Kimura |
| 2006/0118178 A1 | 6/2006 | Desbiolles et al. |
| 2006/0121724 A1 | 6/2006 | Yue et al. |
| 2006/0124242 A1 | 6/2006 | Kanarik et al. |
| 2006/0130971 A1 | 6/2006 | Chang et al. |
| 2006/0157449 A1 | 7/2006 | Takahashi et al. |
| 2006/0162661 A1 | 7/2006 | Jung et al. |
| 2006/0166107 A1* | 7/2006 | Chen ..................... C23F 4/00 430/5 |
| 2006/0166515 A1 | 7/2006 | Karim et al. |
| 2006/0169327 A1 | 8/2006 | Shajii et al. |
| 2006/0178008 A1 | 8/2006 | Yeh et al. |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210723 A1 | 9/2006 | Ishizaka |

(56) References Cited

U.S. PATENT DOCUMENTS

| | | |
|---|---|---|
| 2006/0215347 A1 | 9/2006 | Wakabayashi et al. |
| 2006/0216878 A1 | 9/2006 | Lee |
| 2006/0219360 A1 | 10/2006 | Iwasaki |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara et al. |
| 2006/0246717 A1 | 11/2006 | Wang |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0292846 A1 | 12/2006 | Pinto et al. |
| 2007/0022952 A1 | 2/2007 | Ritchie et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0056925 A1 | 3/2007 | Liu et al. |
| 2007/0062453 A1 | 3/2007 | Ishikawa |
| 2007/0071888 A1 | 3/2007 | Shanmugasundram et al. |
| 2007/0072408 A1 | 3/2007 | Enomoto et al. |
| 2007/0079758 A1 | 4/2007 | Holland et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma |
| 2007/0131274 A1 | 6/2007 | Stollwerck et al. |
| 2007/0134938 A1 | 6/2007 | Kozuka et al. |
| 2007/0145023 A1 | 6/2007 | Holber et al. |
| 2007/0154838 A1 | 7/2007 | Lee |
| 2007/0163440 A1 | 7/2007 | Kim et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0235134 A1 | 10/2007 | Iimuro |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0254169 A1 | 11/2007 | Kamins et al. |
| 2007/0259467 A1 | 11/2007 | Tweet et al. |
| 2007/0264820 A1 | 11/2007 | Liu et al. |
| 2007/0266946 A1 | 11/2007 | Choi |
| 2007/0277734 A1 | 12/2007 | Lubomirsky et al. |
| 2007/0280816 A1 | 12/2007 | Kurita et al. |
| 2007/0281106 A1 | 12/2007 | Lubomirsky et al. |
| 2007/0287292 A1 | 12/2007 | Li et al. |
| 2007/0296967 A1 | 12/2007 | Gupta et al. |
| 2008/0017104 A1 | 1/2008 | Matyushkin et al. |
| 2008/0020570 A1 | 1/2008 | Naik |
| 2008/0044990 A1 | 2/2008 | Lee |
| 2008/0050538 A1 | 2/2008 | Hirata |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102570 A1 | 5/2008 | Fischer et al. |
| 2008/0102640 A1 | 5/2008 | Hassan et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0142831 A1 | 6/2008 | Hua et al. |
| 2008/0153306 A1 | 6/2008 | Cho et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0202688 A1 | 8/2008 | Wu et al. |
| 2008/0202892 A1 | 8/2008 | Smith et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1* | 10/2008 | Kozuka ............ H01L 21/31122 438/710 |
| 2008/0264337 A1 | 10/2008 | Sano et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1 | 1/2009 | Fu et al. |
| 2009/0036292 A1 | 2/2009 | Sun et al. |
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram et al. |
| 2009/0095621 A1 | 4/2009 | Kao et al. |
| 2009/0098276 A1 | 4/2009 | Burrows |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0120464 A1 | 5/2009 | Rasheed et al. |
| 2009/0162647 A1 | 6/2009 | Sun et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0214825 A1 | 8/2009 | Sun et al. |
| 2009/0223928 A1 | 9/2009 | Colpo |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |

(56) References Cited

U.S. PATENT DOCUMENTS

| | | |
|---|---|---|
| 2009/0286400 A1 | 11/2009 | Heo et al. |
| 2009/0294898 A1 | 12/2009 | Feustel et al. |
| 2009/0317978 A1 | 12/2009 | Higashi |
| 2009/0320756 A1 | 12/2009 | Tanaka |
| 2010/0000683 A1 | 1/2010 | Kadkhodayan et al. |
| 2010/0003824 A1 | 1/2010 | Kadkhodayan et al. |
| 2010/0022030 A1 | 1/2010 | Ditizio |
| 2010/0039747 A1 | 2/2010 | Sansoni |
| 2010/0047080 A1 | 2/2010 | Bruce |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0075503 A1 | 3/2010 | Bencher et al. |
| 2010/0081285 A1 | 4/2010 | Chen et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1* | 7/2010 | Nishi ............... H01L 27/14634 257/59 |
| 2010/0187588 A1 | 7/2010 | Gil-Sub et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0207205 A1 | 8/2010 | Grebs et al. |
| 2010/0224324 A1 | 9/2010 | Kasai |
| 2010/0240205 A1 | 9/2010 | Son |
| 2010/0243606 A1 | 9/2010 | Koshimizu |
| 2010/0252068 A1 | 10/2010 | Kannan et al. |
| 2010/0258913 A1 | 10/2010 | Lue |
| 2010/0288369 A1 | 11/2010 | Chang et al. |
| 2010/0294199 A1 | 11/2010 | Tran et al. |
| 2010/0330814 A1 | 12/2010 | Yokota et al. |
| 2011/0005607 A1 | 1/2011 | Desbiolles et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0042799 A1 | 2/2011 | Kim et al. |
| 2011/0045676 A1 | 2/2011 | Park |
| 2011/0048325 A1 | 3/2011 | Choie et al. |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0100489 A1 | 5/2011 | Orito |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0133650 A1 | 6/2011 | Kim |
| 2011/0140229 A1 | 6/2011 | Rachmady et al. |
| 2011/0143542 A1 | 6/2011 | Feurprier et al. |
| 2011/0146909 A1 | 6/2011 | Shih et al. |
| 2011/0147363 A1 | 6/2011 | Yap et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0217851 A1 | 9/2011 | Liang et al. |
| 2011/0226734 A1* | 9/2011 | Sumiya ............... H01J 37/32192 216/41 |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0256421 A1 | 10/2011 | Bose et al. |
| 2011/0265884 A1 | 11/2011 | Xu et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0294300 A1 | 12/2011 | Zhang et al. |
| 2011/0298061 A1 | 12/2011 | Siddiqui et al. |
| 2011/0304078 A1 | 12/2011 | Lee et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1* | 2/2012 | Dhindsa ............... H01J 37/32091 156/345.26 |
| 2012/0034786 A1 | 2/2012 | Dhindsa et al. |
| 2012/0035766 A1 | 2/2012 | Shajii et al. |
| 2012/0052683 A1 | 3/2012 | Kim et al. |
| 2012/0068242 A1 | 3/2012 | Shin et al. |
| 2012/0091108 A1 | 4/2012 | Lin et al. |
| 2012/0097330 A1 | 4/2012 | Iyengar et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0180954 A1 | 7/2012 | Yang et al. |
| 2012/0181599 A1 | 7/2012 | Lung |
| 2012/0182808 A1 | 7/2012 | Lue et al. |
| 2012/0196447 A1 | 8/2012 | Yang et al. |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0238102 A1 | 9/2012 | Zhang et al. |
| 2012/0238103 A1 | 9/2012 | Zhang et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0258600 A1 | 10/2012 | Godet et al. |
| 2012/0267346 A1 | 10/2012 | Kao et al. |
| 2012/0282779 A1 | 11/2012 | Arnold et al. |
| 2012/0285619 A1 | 11/2012 | Matyushkin et al. |
| 2012/0285621 A1 | 11/2012 | Tan |

(56) References Cited

U.S. PATENT DOCUMENTS

| | | |
|---|---|---|
| 2012/0292664 A1 | 11/2012 | Kanike |
| 2012/0309204 A1 | 12/2012 | Kang et al. |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012030 A1 | 1/2013 | Lakshmanan et al. |
| 2013/0012032 A1 | 1/2013 | Liu et al. |
| 2013/0023124 A1 | 1/2013 | Nemani et al. |
| 2013/0026135 A1 | 1/2013 | Kim |
| 2013/0032574 A1 | 2/2013 | Liu et al. |
| 2013/0034666 A1 | 2/2013 | Liang |
| 2013/0034968 A1 | 2/2013 | Zhang et al. |
| 2013/0045605 A1 | 2/2013 | Wang et al. |
| 2013/0052804 A1 | 2/2013 | Song |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0087309 A1 | 4/2013 | Volfovski |
| 2013/0089988 A1 | 4/2013 | Wang et al. |
| 2013/0098868 A1 | 4/2013 | Nishimura et al. |
| 2013/0105948 A1 | 5/2013 | Kewley |
| 2013/0115372 A1 | 5/2013 | Pavol et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0150303 A1 | 6/2013 | Kungl et al. |
| 2013/0161726 A1 | 6/2013 | Kim et al. |
| 2013/0171810 A1 | 7/2013 | Sun et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0217243 A1 | 8/2013 | Underwood et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0279066 A1 | 10/2013 | Lubomirsky et al. |
| 2013/0284369 A1 | 10/2013 | Kobayashi et al. |
| 2013/0284370 A1 | 10/2013 | Collins et al. |
| 2013/0284373 A1 | 10/2013 | Sun et al. |
| 2013/0284374 A1 | 10/2013 | Lubomirsky et al. |
| 2013/0286530 A1 | 10/2013 | Lin et al. |
| 2013/0295297 A1 | 11/2013 | Chou et al. |
| 2013/0298942 A1 | 11/2013 | Ren et al. |
| 2013/0302980 A1 | 11/2013 | Chandrashekar et al. |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo |
| 2014/0008880 A1 | 1/2014 | Miura et al. |
| 2014/0020708 A1 | 1/2014 | Kim et al. |
| 2014/0021673 A1 | 1/2014 | Chen et al. |
| 2014/0026813 A1 | 1/2014 | Wang et al. |
| 2014/0057447 A1 | 2/2014 | Yang et al. |
| 2014/0062285 A1 | 3/2014 | Chen |
| 2014/0065827 A1 | 3/2014 | Kang et al. |
| 2014/0065842 A1 | 3/2014 | Anthis et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0102367 A1 | 4/2014 | Ishibashi |
| 2014/0124364 A1 | 5/2014 | Yoo et al. |
| 2014/0134847 A1 | 5/2014 | Seya |
| 2014/0141621 A1 | 5/2014 | Ren et al. |
| 2014/0147126 A1 | 5/2014 | Linnartz et al. |
| 2014/0152312 A1 | 6/2014 | Snow et al. |
| 2014/0154668 A1 | 6/2014 | Chou et al. |
| 2014/0154889 A1 | 6/2014 | Wang et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0186772 A1 | 7/2014 | Pohlers et al. |
| 2014/0190410 A1 | 7/2014 | Kim |
| 2014/0191388 A1 | 7/2014 | Chen |
| 2014/0199851 A1 | 7/2014 | Nemani et al. |
| 2014/0209245 A1 | 7/2014 | Yamamoto et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263172 A1 | 9/2014 | Xie et al. |
| 2014/0263272 A1 | 9/2014 | Duan et al. |
| 2014/0264533 A1 | 9/2014 | Simsek-Ege et al. |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273487 A1 | 9/2014 | Deshmukh et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0060265 A1 | 3/2015 | Cho et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1 | 4/2015 | Zope |
| 2015/0118858 A1 | 4/2015 | Takaba |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0152072 A1 | 6/2015 | Cantat et al. |
| 2015/0155177 A1 | 6/2015 | Zhang et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0187625 A1 | 7/2015 | Busche et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1 | 7/2015 | Ko et al. |
| 2015/0221541 A1 | 8/2015 | Nemani et al. |
| 2015/0235809 A1 | 8/2015 | Ito et al. |

(56) References Cited

U.S. PATENT DOCUMENTS

| | | |
|---|---|---|
| 2015/0235860 A1 | 8/2015 | Tomura et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0294980 A1 | 10/2015 | Lee et al. |
| 2015/0332930 A1 | 11/2015 | Wang et al. |
| 2015/0340225 A1 | 11/2015 | Kim et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0380431 A1 | 12/2015 | Kanamori et al. |
| 2016/0005572 A1 | 1/2016 | Liang et al. |
| 2016/0005833 A1 | 1/2016 | Collins et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0056167 A1 | 2/2016 | Wang et al. |
| 2016/0064233 A1 | 3/2016 | Wang et al. |
| 2016/0079072 A1 | 3/2016 | Wang et al. |
| 2016/0086772 A1 | 3/2016 | Khaja |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0109863 A1 | 4/2016 | Valcore et al. |
| 2016/0117425 A1 | 4/2016 | Povolny et al. |
| 2016/0118227 A1 | 4/2016 | Valcore et al. |
| 2016/0118268 A1 | 4/2016 | Ingle et al. |
| 2016/0126118 A1 | 5/2016 | Chen et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0172216 A1 | 6/2016 | Marakhtanov et al. |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0196969 A1 | 7/2016 | Berry et al. |
| 2016/0204009 A1 | 7/2016 | Nguyen et al. |
| 2016/0222522 A1 | 8/2016 | Wang et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |
| 2016/0293438 A1 | 10/2016 | Zhou et al. |
| 2016/0300694 A1 | 10/2016 | Yang et al. |
| 2016/0307772 A1 | 10/2016 | Choi et al. |
| 2016/0314961 A1 | 10/2016 | Liu et al. |
| 2016/0314985 A1 | 10/2016 | Yang et al. |
| 2016/0343548 A1 | 11/2016 | Howald et al. |
| 2017/0040175 A1 | 2/2017 | Xu et al. |
| 2017/0040190 A1 | 2/2017 | Benjaminson et al. |
| 2017/0040191 A1 | 2/2017 | Benjaminson et al. |
| 2017/0040207 A1 | 2/2017 | Purayath |
| 2017/0062184 A1 | 3/2017 | Tran et al. |
| 2017/0110290 A1 | 4/2017 | Kobayashi et al. |
| 2017/0110475 A1 | 4/2017 | Liu et al. |
| 2017/0178924 A1 | 6/2017 | Chen et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236691 A1 | 8/2017 | Liang et al. |

FOREIGN PATENT DOCUMENTS

| | | |
|---|---|---|
| CN | 101378850 A | 10/2006 |
| CN | 101123186 A | 2/2008 |
| CN | 101236893 A | 8/2008 |
| EP | 1675160 A1 | 6/2006 |
| JP | S59-126778 A | 7/1984 |
| JP | H01-200627 A | 8/1989 |
| JP | H02-114525 A | 4/1990 |
| JP | H05-226653 A | 9/1993 |
| JP | H06-252099 A | 9/1994 |
| JP | 07-130713 A | 5/1995 |
| JP | H07-153739 A | 6/1995 |
| JP | H8-31755 A | 2/1996 |
| JP | H08-107101 A | 4/1996 |
| JP | H08-264510 A | 10/1996 |
| JP | H0-9260356 A | 10/1997 |
| JP | 2001-313282 A | 11/2001 |
| JP | 2002-075972 A | 3/2002 |
| JP | 2002-083869 A | 3/2002 |
| JP | 2003-174020 A | 6/2003 |
| JP | 2004-508709 A | 3/2004 |
| JP | 2004-296467 A | 10/2004 |
| JP | 2005-050908 A | 2/2005 |
| JP | 2006-041039 A | 2/2006 |
| JP | 2006-066408 A | 3/2006 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2011-518408 A | 6/2011 |
| JP | 4763293 B2 | 8/2011 |
| JP | 2011-171378 A | 9/2011 |
| JP | 2012-019194 A | 1/2012 |
| JP | 2012-19164 A | 3/2012 |
| JP | 2012-512531 A | 5/2012 |
| JP | 2013-243418 A | 12/2013 |
| JP | 5802323 B2 | 10/2015 |
| KR | 10-2000-008278 A | 2/2000 |
| KR | 10-2003-0054726 A | 7/2003 |
| KR | 100441297 B1 | 7/2004 |
| KR | 10-2005-0007143 A | 1/2005 |
| KR | 10-2005-0042701 A | 5/2005 |
| KR | 10-2006-0080509 A | 7/2006 |
| KR | 1006-41762 B1 | 11/2006 |
| KR | 100712727 B1 | 4/2007 |
| KR | 10-2008-0063988 A | 7/2008 |
| KR | 10-2009-0040869 A | 4/2009 |
| KR | 10-2009-0128913 A | 12/2009 |
| KR | 10-2010-0013980 A | 2/2010 |
| KR | 10-2011-0086540 A | 7/2011 |
| KR | 10-2011-0126675 A | 11/2011 |
| KR | 10-2012-0022251 A | 3/2012 |
| KR | 10-2012-0082640 A | 7/2012 |
| KR | 10-2016-0002543 A | 1/2016 |
| TW | 2007-35196 A | 9/2007 |
| TW | 2011-27983 A1 | 8/2011 |
| TW | 2012-07919 | 2/2012 |
| TW | 2012-13594 A | 4/2012 |
| TW | 2012-33842 A1 | 8/2012 |
| WO | 2008-112673 A2 | 9/2008 |
| WO | 2009-084194 A1 | 7/2009 |
| WO | 2010-010706 | 1/2010 |
| WO | 2011-027515 A | 3/2011 |
| WO | 2011-031556 A | 3/2011 |
| WO | 2011-149638 A | 12/2011 |
| WO | 2012-050321 A | 4/2012 |

(56) References Cited

FOREIGN PATENT DOCUMENTS

| WO | 2012-118987 A1 | 9/2012 |
|----|----------------|--------|
| WO | 2012-125656 A2 | 9/2012 |
| WO | 2012-125654    | 9/2015 |

OTHER PUBLICATIONS

Manual No. TQMA72E1. "Bayard-Alpert Pirani Gauge Frg-730: Short Operating Instructions" Mar. 2012. Agilent Technologies, Lexington, MA 02421, USA. pp. 1-45.

Office Action dated May 20, 2016 in Taiwan Patent Application No. 101108503, all pages.

H. Xiao, Introduction to Semiconductor Manufacturing Technology, published by Prentice Hall, 2001, ISBN 0-13-022404-9, pp. 354-356.

International Search Report and Written Opinion of PCT/US2016/045551 dated Nov. 17, 2016, all pages.

International Search Report and Written Opinion of PCT/US2016/045543 dated Nov. 17, 2016, all pages.

International Search Report and Written Opinion of PCT/US2012/028952 dated Oct. 29, 2012, 9 pages.

Office Action dated Jun. 30, 2015 for Chinese Patent Application No. 201280013237.2, 17 pages.

Office Action dated Oct. 6, 2015 for Japanese Patent Application No. 2013-558123, 6 pages.

Instrument Manual: Vacuum Gauge Model MM200, Rev D. TELEVAC (website: www.televac.com), A Division of the Fredericks Company, Huntingdonvalley, PA, US. 2008. pp. 162.

Instrument Manual: Vacuum Gauge Model MM200, Rev D. TELEVAC (website: www.televac.com), A Division of the Fredericks Company, Huntingdon Valley, PA, US. 2008. pp. 162.

J.J. Wang and et al., "Inductively coupled plasma etching of bulk 1-20 6H-SiC and thin-film SiCN in NF3 chemistries," Journal of Vacuum Science & Technology A: Vacuum, Surfaces, and Films 16, 2204 (1998).

\* cited by examiner

METHODS FOR ETCH OF METAL AND METAL-OXIDE FILMS

CROSS-REFERENCES TO RELATED APPLICATIONS

The present application is a continuation of U.S. patent application Ser. No. 13/416,223, filed Mar. 9, 2012, and claims benefit of priority under 35 U.S.C. § 119(e) of U.S. Provisional Application No. 61/452,522, filed Mar. 14, 2011, the entire contents of which are hereby incorporated by reference in their entirety for all purposes.

The present application is also related to U.S. Nonprovisional patent application Ser. No. 13/088,930, filed Apr. 18, 2011; Ser. No. 13/251,663, filed Oct. 3, 2011; and concurrently filed U.S. Nonprovisional patent application Ser. No. 13/416,277, filed Mar. 9, 2012; the entire contents of which are hereby incorporated by reference in their entirety for all purposes.

BACKGROUND

Integrated circuits are made possible by processes which produce intricately patterned layers of materials on substrate surfaces. Producing patterned material on a substrate requires controlled methods for removal of exposed materials. Chemical etching is used for a variety of purposes including transferring a pattern in photoresist into underlying layers, thinning layers, or increasing lateral dimensions of features already present on the surface. Often it is desirable to have an etch process which etches one material faster than another. Such an etch process is said to be selective to the first material. As a result of the diversity of materials, circuits, and processes, etch processes have been developed with a selectivity towards a variety of materials.

Plasma deposition and etching processes for fabricating semiconductor integrated circuits have been in wide use for decades. These processes typically involve the formation of a plasma from gases that are exposed to electric fields of sufficient power inside the processing chamber to cause the gases to ionize. The temperatures needed to form these plasmas can be much lower than needed to thermally ionize the same gases. Thus, plasma generation processes can be used to generate reactive radical and ion species at significantly lower chamber processing temperatures than is possible by simply heating the gases. This allows the plasma to deposit and/or etch materials from substrate surfaces without raising the substrate temperature above a threshold that will melt, decompose, or otherwise damage materials on the substrate.

Exemplary plasma deposition processes include plasma-enhanced chemical vapor deposition (PECVD) of dielectric materials such as silicon oxide on exposed surfaces of a substrate wafer. Conventional PECVD involves the mixing of gases and/or deposition precursors in the processing chamber and striking a plasma from the gases to generate reactive species that react and deposit material on the substrate. The plasma is typically positioned close to the exposed surface of the substrate to facilitate the efficient deposition of the reaction products.

Similarly, plasma etching processes include exposing selected parts of the substrate to plasma activated etching species that chemically react and/or physically sputter materials from the substrate. The removal rates, selectivity, and direction of the plasma etched materials can be controlled with adjustments to the etchant gases, plasma excitation energy, and electrical bias between the substrate and charged plasma species, among other parameters. Some plasma techniques, such as high-density plasma chemical vapor deposition (HDP-CVD), rely on simultaneous plasma etching and deposition to deposit films on the substrate.

While plasma environments are generally less destructive to substrates than high-temperature deposition environments, they still create fabrication challenges. Etching precision can be a problem with energetic plasmas that over-etch shallow trenches and gaps. Energetic species in the plasmas, especially ionized species, can create unwanted reactions in a deposited material that adversely affect the material's performance. Thus, there is a need for systems and methods to provide more precise control over the plasma components that make contact with a substrate wafer during fabrication.

SUMMARY

Systems and methods are described for improved control of the environment between a plasma and the surfaces of a substrate wafer that are exposed to plasma and/or its effluents. The improved control may be realized at least in part by an ion suppression element positioned between the plasma and the substrate that reduces or eliminates the number of ionically-charged species that reach the substrate. Adjusting the concentration of ion species that reach the substrate surface allows more precise control of the etch rate, etch selectivity, and deposition chemistry (among other parameters) during a plasma assisted etch and/or deposition on the substrate.

In an embodiment, a method of selectively etching a metal-containing film from a substrate comprising a metal-containing layer and a silicon oxide layer is provided. The method includes flowing a fluorine-containing gas into a plasma generation region of a substrate processing chamber, and applying energy to the fluorine-containing gas to generate a plasma in the plasma generation region. The plasma comprises fluorine radicals and fluorine ions. The method also includes filtering the plasma to provide a reactive gas having a higher concentration of fluorine radicals than fluorine ions, and flowing the reactive gas into a gas reaction region of the substrate processing chamber. The method also includes exposing the substrate to the reactive gas in the gas reaction region of the substrate processing chamber. The reactive gas etches the metal-containing layer at a higher etch rate than the reactive gas etches the silicon oxide layer.

In another embodiment, an etch process providing a higher etch rate of a metal-containing film than an etch rate of a dielectric film is provided. The process includes generating a plasma from a fluorine-containing gas. The plasma comprises fluorine radicals and fluorine ions. The process also includes removing a portion of the fluorine ions from the plasma to provide a reactive gas having a higher concentration of fluorine radicals than fluorine ions, and exposing a substrate comprising a metal-containing layer and a dielectric layer to the reactive gas. The reactive gas etches the metal-containing layer at a higher etch rate than the reactive gas etches the dielectric layer.

Additional embodiments and features are set forth in part in the description that follows and will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings, wherein like reference numerals are used throughout the several drawings to refer to similar components. In some instances, a sub-label is associated with a reference numeral and follows a hyphen to denote one of multiple similar components. When reference is made to a reference numeral without specifying an existing sub-label, it is intended to refer to all such multiple similar components.

DETAILED DESCRIPTION

Systems and methods are described for the generation and control of a plasma inside a semiconductor processing chamber. The plasma may originate inside the processing chamber, outside the processing chamber in a remote plasma unit, or both. Inside the chamber, the plasma is contained and separated from the substrate wafer with the help of an ion suppression element that is positioned between the plasma and the substrate wafer. In some instances, this ion suppression element may also function as part of a plasma generation unit (e.g., an electrode), a gas/precursor distribution system (e.g., a showerhead), and/or another component of the processor system. In additional instances, the ion suppression element may function primarily to define a partition between a plasma generation region and a gas reaction region that etches and/or deposits material on exposed surfaces of the substrate wafer.

The ion suppression element functions to reduce or eliminate ionically charged species traveling from the plasma generation region to the substrate. Uncharged neutral and radical species may pass through the openings in the ion suppressor to react at the substrate. It should be noted that complete elimination of ionically charged species in the reaction region surrounding the substrate is not always the desired goal. In many instances, ionic species are required to reach the substrate in order to perform the etch and/or deposition process. In these instances, the ion suppressor helps control the concentration of ionic species in the reaction region at a level that assists the process.

Exemplary Processing System Configurations

Exemplary processing system configurations include an ion suppressor positioned inside a processing chamber to control the type and quantity of plasma excited species that reach the substrate. In some embodiments the ion suppressor unit may be a perforated plate that may also act as an electrode of the plasma generating unit. In additional embodiments the ion suppressor may be the showerhead that distributes gases and excited species to a reaction region in contact with the substrate. In still more embodiments ion suppression may be realized by a perforated plate ion suppressor and a showerhead, both of which plasma excited species pass through to reach the reaction region.

Figure 1:
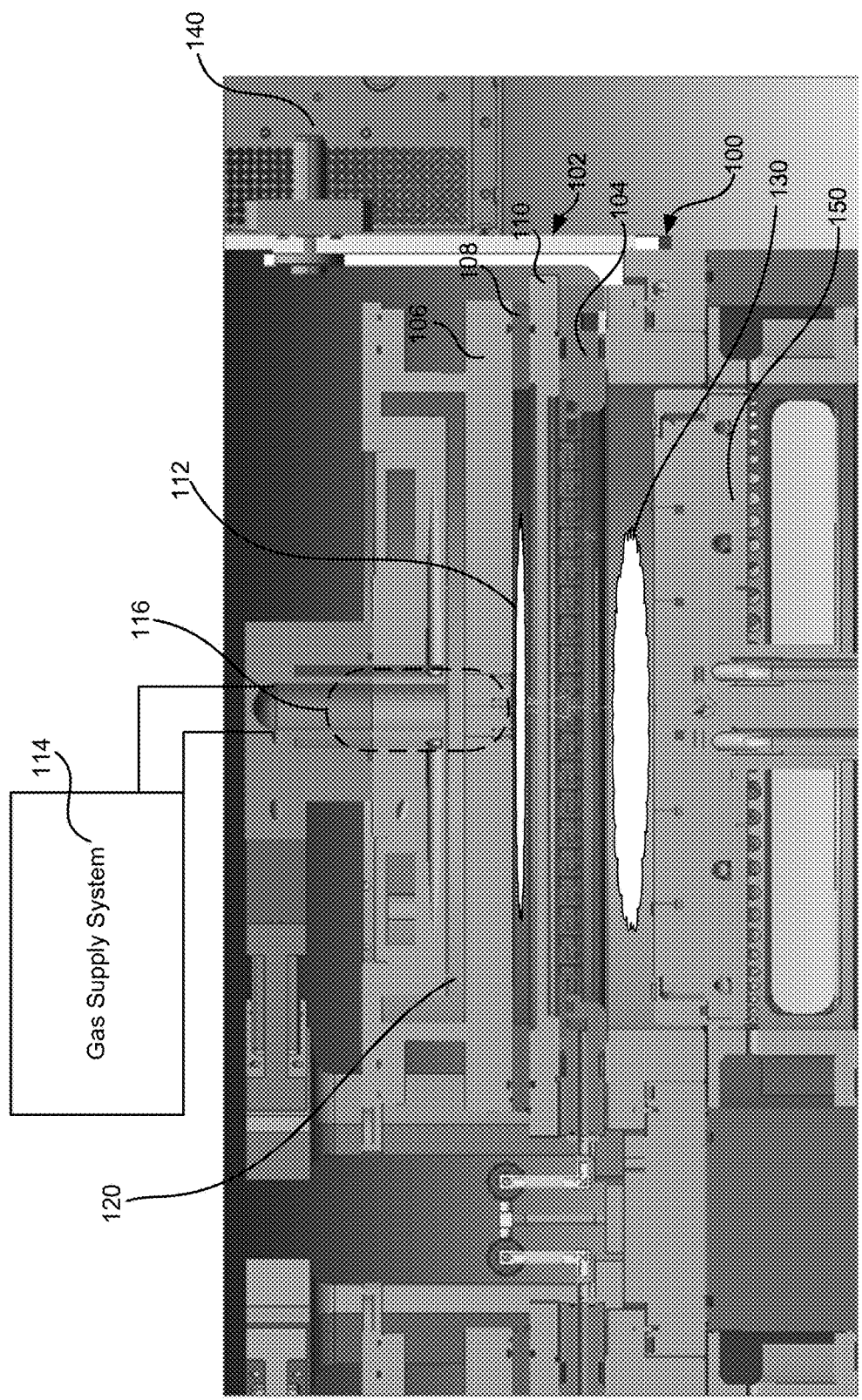
FIG. 1 shows a simplified cross-sectional view of a processing system that includes a processing chamber having a capacitively coupled plasma (CCP) unit and a showerhead according to an embodiment of the invention.
Figure 2:
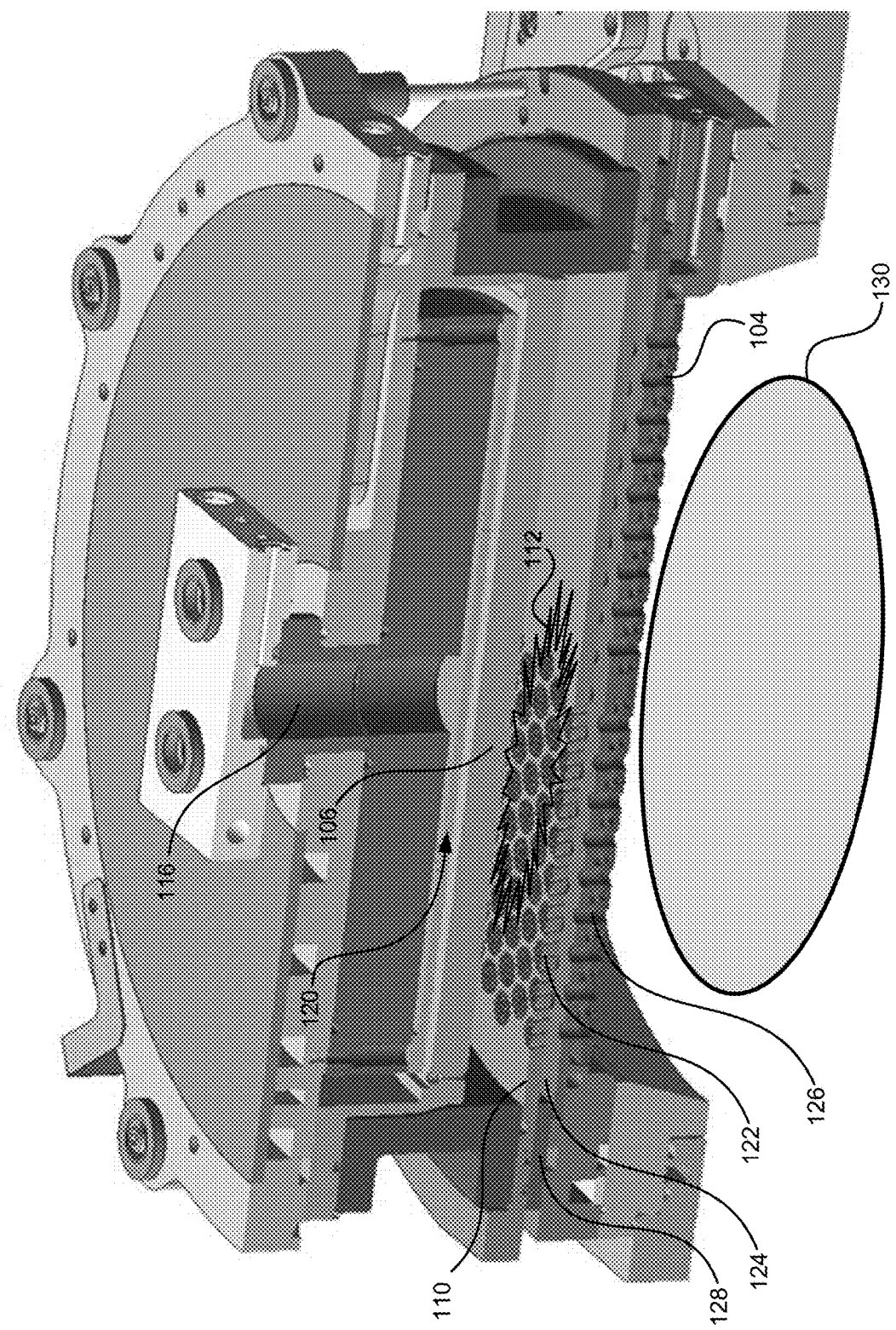
FIG. 2 shows a simplified perspective view of a processing system that includes a processing chamber having a CCP unit and a showerhead according to an embodiment of the invention.

FIGS. 1 and 2 show simplified cross-sectional and perspective views, respectively, of a processing system that includes both an ion suppressor 110 as part of a capacitively coupled plasma (CCP) unit 102 and a showerhead 104 that may also contribute to ion suppression. The processing system may also optionally include components located outside the processing chamber 100, such as fluid supply system 114. The processing chamber 100 may hold an internal pressure different than the surrounding pressure. For example, the pressure inside the processing chamber may be about 1 mTorr to about 100 Torr.

The CCP unit 102 may function to generate a plasma inside the processing chamber 100. The components of the CCP unit 102 may include a lid or hot electrode 106 and an ion suppression element 110 (also referred to herein as an ion suppressor). In some embodiments, the lid 106 and ion suppressor 110 are electrically conductive electrodes that can be electrically biased with respect to each other to generate an electric field strong enough to ionize gases between the electrodes into a plasma. An electrical insulator 108, may separate the lid 106 and the ion suppressor 110 electrodes to prevent them from short circuiting when a plasma is generated. The plasma exposed surfaces of the lid 106, insulator 108, and ion suppressor 110 may define a plasma excitation region 112 in the CCP unit 102.

Plasma generating gases may travel from a gas supply system 114 through a gas inlet 116 into the plasma excitation region 112. The plasma generating gases may be used to strike a plasma in the excitation region 112, or may maintain a plasma that has already been formed. In some embodiments, the plasma generating gases may have already been at least partially converted into plasma excited species in a remote plasma system (not shown) positioned outside the processing chamber 100 before traveling downstream though the inlet 116 to the CCP unit 102. When the plasma excited species reach the plasma excitation region 112, they may be further excited in the CCP unit 102, or pass through the plasma excitation region without further excitation. In some operations, the degree of added excitation provided by the CCP unit 102 may change over time depending on the substrate processing sequence and/or conditions.

The plasma generating gases and/or plasma excited species may pass through a plurality of holes (not shown) in lid 106 for a more uniform delivery into the plasma excitation region 112. Exemplary configurations include having the inlet 116 open into a gas supply region 120 partitioned from the plasma excitation region 112 by lid 106 so that the gases/species flow through the holes in the lid 106 into the plasma excitation region 112. Structural and operational features may be selected to prevent significant backflow of plasma from the plasma excitation region 112 back into the supply region 120, inlet 116, and fluid supply system 114. The structural features may include the selection of dimensions and cross-sectional geometry of the holes in lid 106 that deactivates back-streaming plasma, as described below with reference to FIGS. 7A and 7B. The operational features may include maintaining a pressure difference between the gas supply region 120 and plasma excitation region 112 that maintains a unidirectional flow of plasma through the ion suppressor 110.

As noted above, the lid 106 and the ion suppressor 110 may function as a first electrode and second electrode, respectively, so that the lid 106 and/or ion suppressor 110 may receive an electric charge. In these configurations, electrical power (e.g., RF power) may be applied to the lid 106, ion suppressor 110, or both. For example, electrical power may be applied to the lid 106 while the ion suppressor 110 is grounded. The substrate processing system may include a RF generator 140 that provides electrical power to the lid 106 and/or ion suppressor 110. The electrically charged lid 106 may facilitate a uniform distribution of plasma (i.e., reduce localized plasma) within the plasma excitation region 112. To enable the formation of a plasma in the plasma excitation region 112, insulator 108 may electrically insulate lid 106 and ion suppressor 110. Insulator 108 may be made from a ceramic and may have a high breakdown voltage to avoid sparking. The CCP unit 102 may further include a cooling unit (not shown) that includes one or more cooling fluid channels to cool surfaces exposed to the plasma with a circulating coolant (e.g., water).

The ion suppressor 110 may include a plurality of holes 122 that suppress the migration of ionically-charged species out of the plasma excitation region 112 while allowing uncharged neutral or radical species to pass through the ion suppressor 110 into an activated gas delivery region 124. These uncharged species may include highly reactive species that are transported with less reactive carrier gas through the holes 122. As noted above, the migration of ionic species through the holes 122 may be reduced, and in some instances completely suppressed. Controlling the amount of ionic species passing through the ion suppressor 110 provides increased control over the gas mixture brought into contact with the underlying wafer substrate, which in turn increases control of the deposition and/or etch characteristics of the gas mixture. For example, adjustments in the ion concentration of the gas mixture can significantly alter its etch selectivity (e.g., SiNx:SiOx etch ratios, metal:SiOx etch ratios, metal:SiNx etch ratios, Poly-Si:SiOx etch ratios, etc.). It can also shift the balance of conformal-to-flowable of a deposited dielectric material.

The plurality of holes 122 may be configured to control the passage of the activated gas (i.e., the ionic, radical, and/or neutral species) through the ion suppressor 110. For example, the aspect ratio of the holes (i.e., the hole diameter to length) and/or the geometry of the holes may be controlled so that the flow of ionically-charged species in the activated gas passing through the ion suppressor 110 is reduced. The holes in the ion suppressor 110 may include a tapered portion that faces the plasma excitation region 112, and a cylindrical portion that faces the showerhead 104. The cylindrical portion may be shaped and dimensioned to control the flow of ionic species passing to the showerhead 104. An adjustable electrical bias may also be applied to the ion suppressor 110 as an additional means to control the flow of ionic species through the suppressor.

The showerhead 104 is positioned between the ion suppressor 110 of the CCP unit 102 and a gas reaction region 130 (i.e., gas activation region) that makes contact with a substrate that may be mounted on a pedestal 150. The gases and plasma excited species may pass through the ion suppressor 110 into an activated gas delivery region 124 that is defined between the ion suppressor 110 and the showerhead 104. Annular component 128 may be positioned between the ion suppressor 110 and the showerhead 104 to define the activated gas delivery region 124. A portion of these gases and species may further pass thorough the showerhead 104 into a gas reaction region 130 that makes contact with the substrate.

The showerhead may be a dual-zone showerhead that has a first set of channels 126 to permit the passage of plasma excited species, and a second set of channels that deliver a second gas/precursor mixture into the gas reaction/activation region 130. The two sets of channels prevent the plasma excited species and second gas/precursor mixture from combining until they reach the gas reaction region 130. In some embodiments, one or more of the holes 122 in the ion suppressor 110 may be aligned with one or more of the channels 126 in the showerhead 104 to allow at least some of the plasma excited species to pass through a hole 122 and a channel 126 without altering their direction of flow. In additional embodiments, the second set of channels may have an annular shape at the opening facing the gas reaction region 130, and these annular openings may be concentrically aligned around the circular openings of the first set of channels 126.

The second set of channels in the showerhead 104 may be fluidly coupled to a source gas/precursor mixture (not shown) that is selected for the process to be performed. For example, when the processing system is configured to perform a deposition of a dielectric material such as silicon dioxide ($SiO_x$) the gas/precursor mixture may include a silicon-containing gas or precursor such as silane, disilane, TSA, DSA, TEOS, OMCTS, TMDSO, among other silicon-containing materials. This mixture may react in gas reaction region 130 with an oxidizing gas mixture that may include plasma excited species such as plasma generated radical oxygen (O), activated molecular oxygen ($O_2$), and ozone ($O_3$), among other species. Excessive ions in the plasma excited species may be reduced as the species move through the holes 122 in the ion suppressor 110, and reduced further as the species move through the channels 126 in the showerhead 104. In another example, when the processing system is configured to perform an etch on the substrate surface, the source gas/precursor mixture may include etchants such as oxidants, halogens, water vapor and/or carrier gases that mix in the gas reaction region 130 with plasma excited species distributed from the first set of channels in the showerhead 104.

The processing system may further include a power supply 140 electrically coupled to the CCP unit 102 to provide electric power to the lid 106 and/or ion suppressor 110 to generate a plasma in the plasma excitation region 112. The power supply may be configured to deliver an adjustable amount of power to the CCP unit 102 depending on the process performed. In deposition processes, for example, the power delivered to the CCP unit 102 may be adjusted to set the conformality of the deposited layer. Deposited dielectric films are typically more flowable at lower plasma powers and shift from flowable to conformal when the plasma power is increased. For example, an argon containing plasma maintained in the plasma excitation region 112 may produce a more flowable silicon oxide layer as the plasma power is decreased from about 1000 Watts to about 100 Watts or lower (e.g., about 900, 800, 700, 600, or 500 Watts or less), and a more conformal layer as the plasma power is increased from about 1000 Watts or more (e.g., about 1000, 1100, 1200, 1300, 1400, 1500, 1600, 1700 Watts or more). As the plasma power increases from low to high, the transition from a flowable to conformal deposited film may be relatively smooth and continuous or progress through relatively discrete thresholds. The plasma power (either alone or in addition to other deposition parameters) may be adjusted to select a balance between the conformal and flowable properties of the deposited film.

The processing system may still further include a pedestal 150 that is operable to support and move the substrate (e.g., a wafer substrate). The distance between the pedestal 150 and the showerhead 104 help define the gas reaction region 130. The pedestal may be vertically or axially adjustable within the processing chamber 100 to increase or decrease the gas reaction region 130 and effect the deposition or etching of the wafer substrate by repositioning the wafer substrate with respect to the gases passed through the showerhead 104. The pedestal 150 may have a heat exchange channel through which a heat exchange fluid flows to control the temperature of the wafer substrate. Circulation of the heat exchange fluid allows the substrate temperature to be maintained at relatively low temperatures (e.g., about −20° C. to about 90° C.). Exemplary heat exchange fluids include ethylene glycol and water.

The pedestal 150 may also be configured with a heating element (such as a resistive heating element) to maintain the substrate at heating temperatures (e.g., about 90° C. to about 1100° C.). Exemplary heating elements may include a single-loop heater element embedded in the substrate support platter that makes two or more full turns in the form of parallel concentric circles. An outer portion of the heater element may run adjacent to a perimeter of the support platen, while an inner portion may run on the path of a concentric circle having a smaller radius. The wiring to the heater element may pass through the stem of the pedestal.

Figure 3:
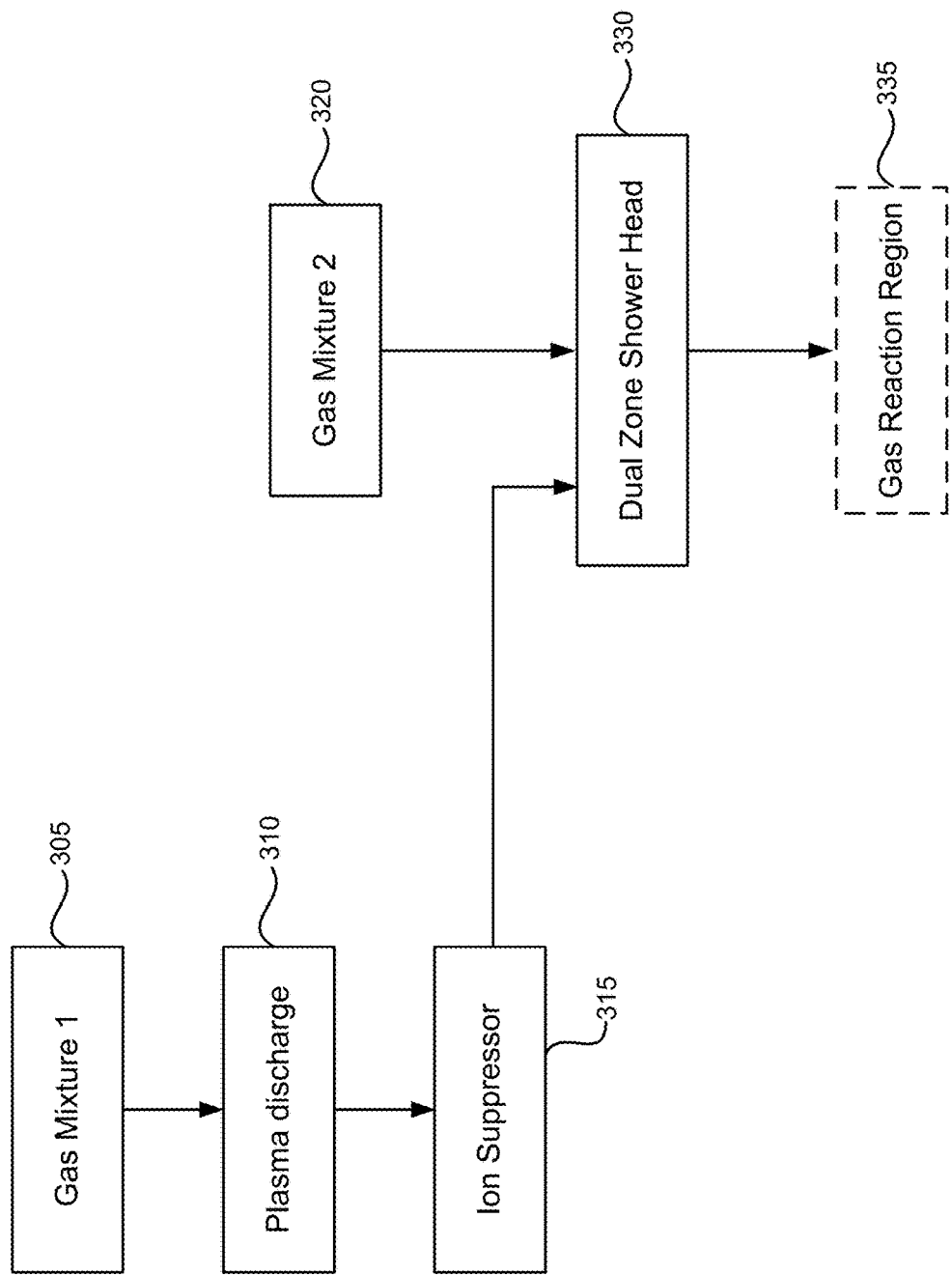
FIG. 3 shows a simplified schematic of the gas flow paths of a pair of gas mixtures through a processing system according to an embodiment of the invention.

FIG. 3 shows a simplified schematic of the gas flow paths of a pair of gas mixtures through a processing system that includes both an ion suppressor plate and a showerhead. At block 305, a first gas, such as a plasma generating gas mixture, is supplied to the processing chamber via a gas inlet. The first gas may include one or more of the following gases: $CF_4$, $NH_3$, $NF_3$, Ar, He, $H_2O$, $H_2$, $O_2$, etc. Inside the processing chamber, the first gas may be excited through a plasma discharge to form one or more plasma effluents at block 310. Alternatively (or in addition to the in-situ plasma generation) a remote plasma system (RPS) coupled to the processing chamber may be used to generate an ex-situ plasma whose plasma excitation products are introduced into the process chamber. The RPS plasma excitation products may include ionically-charged plasma species as well as neutral and radical species.

Whether the plasma effluents are generated by an in-situ plasma unit, an RPS unit, or both, they may be passed through an ion suppressor in the processing chamber at block 315. The ion suppressor may block and/or control the passage of ionic species while allowing the passage of radical and/or neutral species as the plasma activated first gas travels to the gas reaction region in the processing chamber. At block 320, a second gas may be introduced into the processing chamber. As noted above, the contents of the second gas depend on the process performed. For example, the second gas may include deposition compounds (e.g., Si-containing compounds) for deposition processes and etchants for etch processes. Contact and reaction between the first and second gases may be prevented until the gases arrive at the gas reaction region of the process chamber.

One way to prevent the first and second gases from interacting before the gas reaction region is to have them flow though separate channels in a dual-zone showerhead (DZSH). Block 330 shows the activated first gas and second gas passing through a DZSH 33 that has a first plurality of channels that permit the activated first gas to pass through the showerhead without interacting with the second gas that passes through a second plurality of channels. After exiting the DZSH, the first and second gases may mix together in the gas reaction region of the processing chamber at block 335. Depending on the process performed, the combined gases may react to deposit a material on the exposed surfaces of the substrate, etch materials from the substrate, or both.

Figure 4:
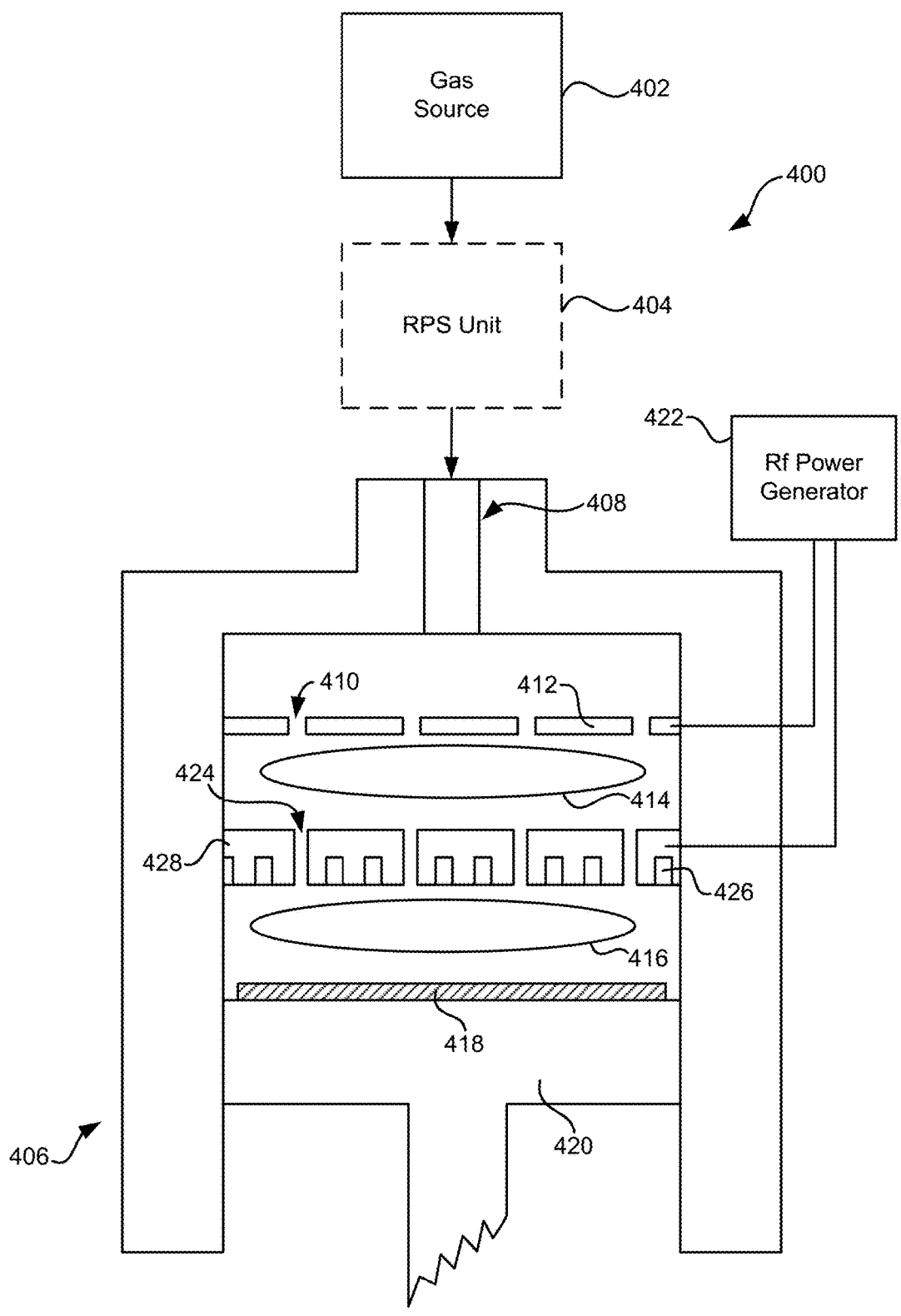
FIG. 4 shows a simplified cross-sectional view of a processing system that includes a processing chamber having a showerhead that also acts as an ion suppression element according to an embodiment of the invention.

Referring now to FIG. 4, a simplified cross-sectional view of a processing system 400 having a showerhead 428 that also acts as an ion suppression element is shown. In the configuration shown, a first gas source 402 for plasma generation 428 is fluidly coupled to an optional RPS unit 404 where a first plasma may be generated and the plasma effluents transported into the processing chamber 406 through gas inlet 408. Inside the processing chamber 406, the gases may pass through holes 410 in a gas distribution plate 412 into a gas region 414 defined between the plate 412 and showerhead 428. In some embodiments, this region 414 may be a plasma excitation/activation region where the gas distribution plate 412 and showerhead 428 act as first and second electrodes to further excite the gas and/or generate the first plasma. The holes 410 in the gas distribution plate 412 may be dimensionally or geometrically structured to deactivate back-streaming plasma. The plate 412 and showerhead 428 may be coupled with a RF power generator 422 that supplies a charge to the plate 412 and showerhead 428 to excite the gases and/or generate a plasma. In one embodiment, the showerhead 428 is grounded while a charge is applied to plate 412.

The excited gases or activated gases in the gas region 414 may pass through showerhead 428 into a gas reaction region 416 adjacent a substrate 418 to etch material from the surface of the substrate and/or deposit material on the substrate's surface. The showerhead 428 may be a DZSH that allows the excited gases to pass from the gas region 414 into the gas reaction region 416 while also allowing a second gas (i.e., precursor gas/mixture) to flow from an external source (not shown) into the gas reaction region 416 via a second gas inlet 426. The DZSH may prevent the activated/excited gas from mixing with the second gas until the gases flow into the gas reaction region 416.

Figure 7A:
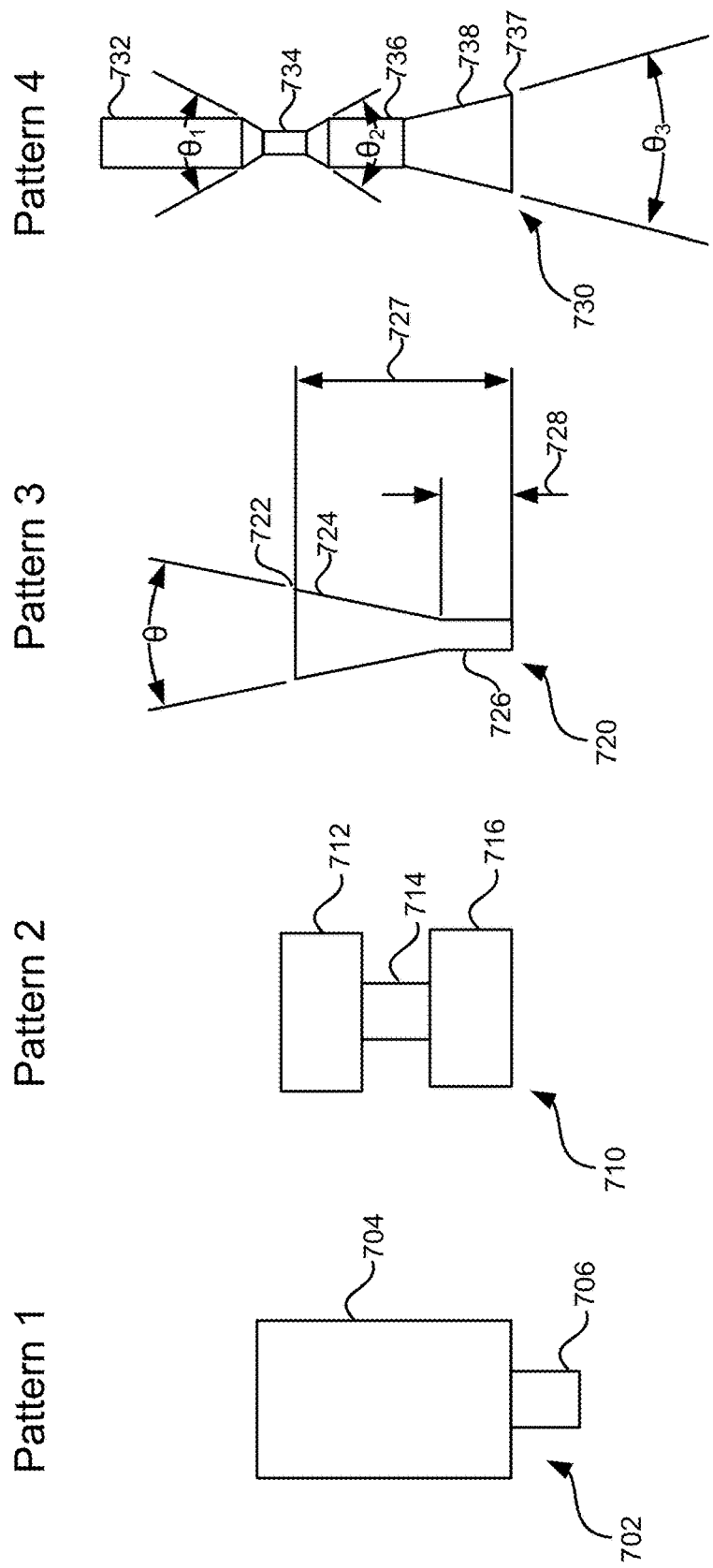
FIG. 7A shows some exemplary hole geometries for the openings in an ion-suppression element according to an embodiment of the invention.

The excited gas may flow through a plurality of holes 424 in the DZSH, which may be dimensionally and/or geometrically structured to control or prevent the passage of plasma (i.e., ionically charged species) while allowing the passage of activated/excited gases (i.e., reactive radical or uncharged neutral species). FIG. 7A provides exemplary embodiments of hole configurations that may be used in the DZSH. In addition to the holes 424, the DZSH may include a plurality of channels 426 through which the second gas flows. The second gas (precursor gas) may exit the showerhead 428 through one or more apertures (not shown) that are positioned adjacent holes 424. The DZSH may act as both a second gas delivery system and an ion suppression element.

As described above, the mixed gases may deposit a material on and/or etch a material from the surface of the substrate 418, which may be positioned on a platen 420. The platen 420 may be vertically movable within the processing chamber 406. The processing of the substrate 418 within the processing chamber 406 may be affected by the configurations of the holes 424, the pressure within the gas region 414, and/or the position of the substrate 418 within the processing chamber. Further, the configuration of the holes 424 and/or pressure within the gas region 414 may control the concentration of ionic species (plasma) allowed to pass into the gas excitation region 416. The ionic concentration of the gas mixture can shift the balance of conformal-to-flowable of a deposited dielectric material in addition to altering the etch selectivity.

Figure 5:
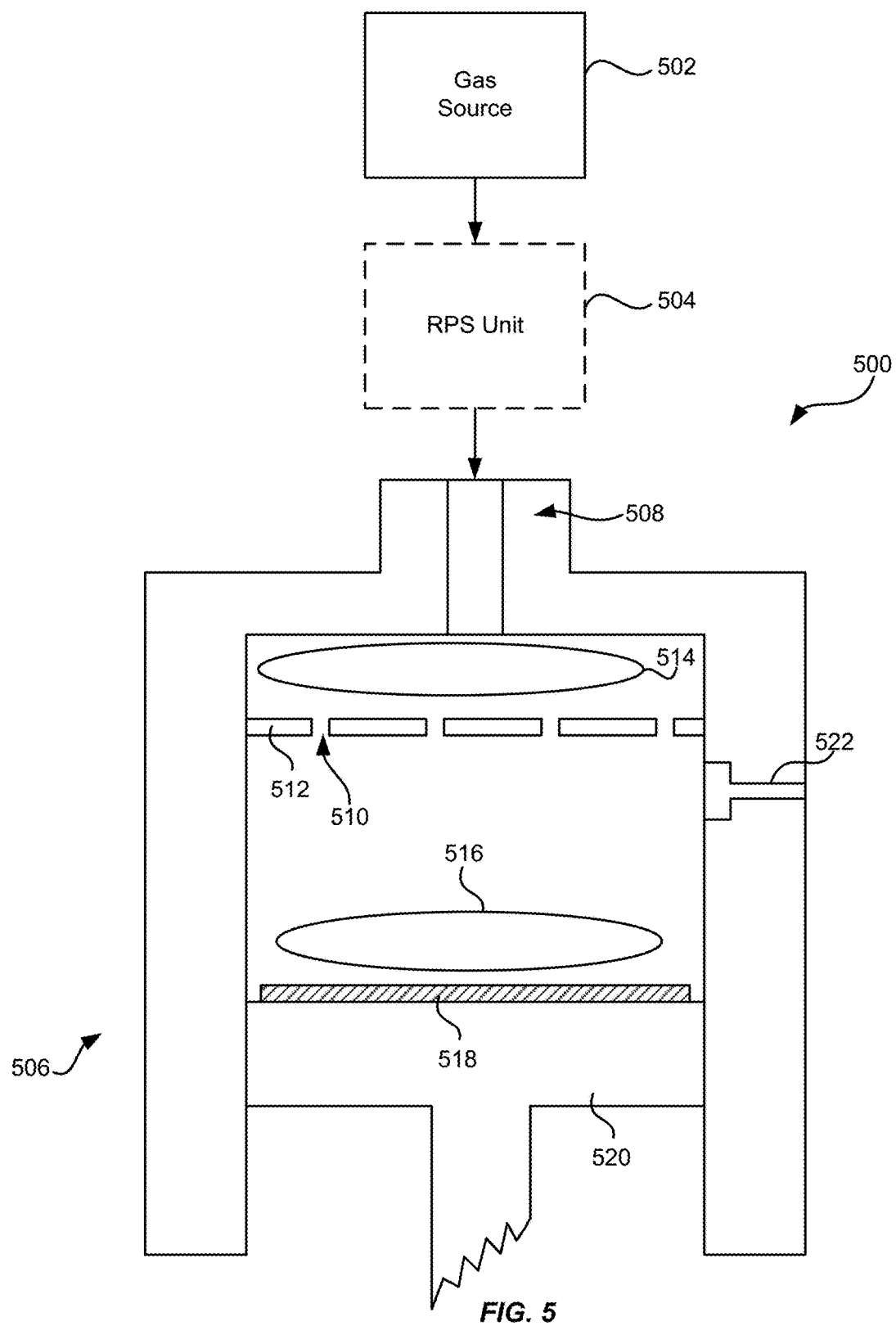
FIG. 5 shows a simplified cross-sectional view of a processing system that includes a processing chamber with an ion suppression plate partitioning a plasma region from gas reaction region according to an embodiment of the invention.

Referring now to FIG. 5, a simplified cross-sectional view of another processing system 500 having a plate 512 (i.e., ion suppressor plate) that acts as an ion suppression element is shown. In the configuration shown, a first gas source 502 is fluidly coupled to an RPS unit 504 where a first plasma may be generated and the plasma effluents transported into the processing chamber 506 through gas inlet 508. The plasma effluents may be transported to a gas region 514 defined between the ion suppressor plate 512 and the gas inlet 508. Inside the gas region 514, the gases may pass through holes 510 in the ion suppressor 512 into a gas reaction/activation region 516 defined between the ion suppressor 512 and a substrate 518. The substrate 518 may be supported on a platen 520 as described above so that the substrate is movable within the processing chamber 506.

Also as described above, the holes 510 may be dimensionally and/or geometrically structured so that the passage of ionically charged species (i.e., plasma) is prevented and/or controlled while the passage of uncharged neutral or radical species (i.e., activated gas) is permitted. The passage of ionic species may be controllable by varying the pressure of the plasma within gas region 514. The pressure in gas region 514 may be controlled by controlling the amount of gas delivered through gas inlet 508. The precursor gas (i.e., second gas) may be introduced into the processing chamber 506 at one or more second gas inlets 522 positioned vertically below or parallel with ion suppressor 512. The second gas inlet 522 may include one or more apertures, tubes, etc. (not shown) in the processing chamber 506 walls and may further include one or more gas distribution channels (not shown) to deliver the precursor gas to the apertures, tubes, etc. In one embodiment, the ion suppressor 512 includes one or more second gas inlets, through which the precursor gas flows. The second gas inlets of the ion suppressor 512 may deliver the precursor gas into the gas reaction region 516. In such an embodiment, the ion suppressor 512 functions as both an ion suppressor and a dual zone showerhead as described previously. The activated gas that passes through the holes 510 and the precursor gas introduced in the processing chamber 506 may be mixed in the gas reaction chamber 516 for etching and/or deposition processes.

Having now described exemplary embodiments of processing chambers, attention is now directed to exemplary embodiments of ion suppressors, such as ion suppressor plates 412 and 512 and showerhead 428.

Exemplary Ion Suppressors

Figure 6A:
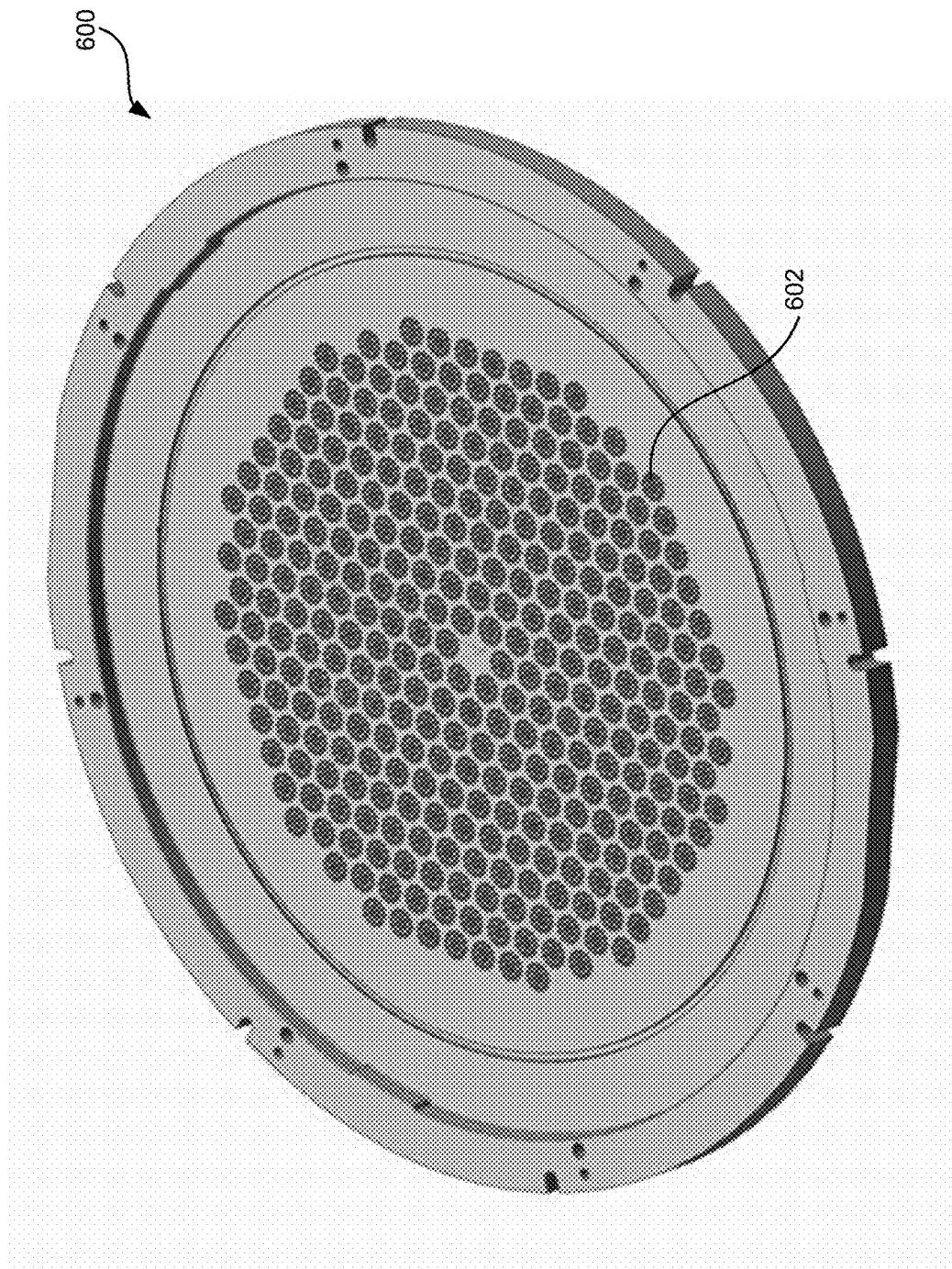
FIG. 6A shows a simplified perspective view of an ion-suppression element according to an embodiment of the invention.

FIG. 6A shows a simplified perspective view of an ion-suppression element 600 (ion suppressor) according to an embodiment of the invention. The ion suppression element 600 may correspond with the ion suppressor plates of FIG. 4 and/or FIG. 5. The perspective view shows the top of the ion suppression element or plate 600. The ion suppression plate 600 may be generally circular shaped and may include a plurality of plasma effluent passageways 602, where each of the passageways 602 includes one or more through holes that allow passage of the plasma effluents from a first region (e.g., plasma region) to a second region (e.g., gas reaction region or showerhead). In one embodiment, the through holes of the passageway 602 may be arranged to form one or more circular patterns, although other configurations are possible. As described previously, the through holes may be geometrically or dimensionally configured to control or prevent the passage of ion species while allowing the passage or uncharged neutral or radical species. The through holes may have a larger inner diameter toward the top surface of the ion suppression plate 600 and a smaller inner diameter toward the bottom surface of the ion suppression plate. Further, the through holes may be generally cylindrical, conical, or any combination thereof. Exemplary embodiments of the configurations of the through holes are provided in FIGS. 7A-B.

The plurality of passageways may be distributed substantially evenly over the surface of the ion suppression plate 600, which may provide even passage of neutral or radical species through the ion suppression plate 600 into the second region. In some embodiments, such as the embodiment of FIG. 5, the processing chamber may only include an ion suppression plate 600, while in other embodiments, the processing chamber may include both a ion suppression plate 600 and a showerhead, such as the showerhead of FIG. 6B, or the processing chamber may include a single plate that acts as both a dual zone showerhead and an ion suppression plate.

Figure 6B:
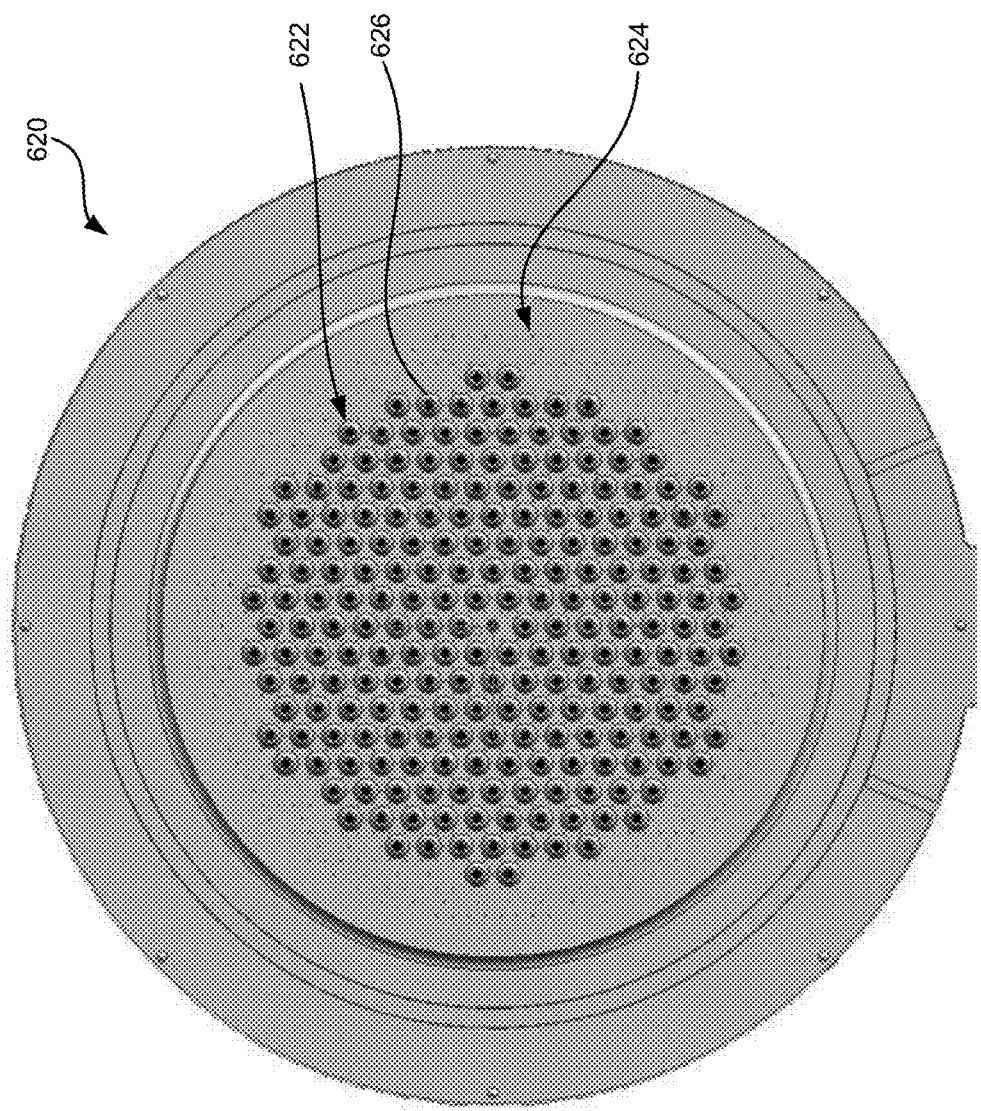
FIG. 6B shows a simplified perspective view of a showerhead that also act as an ion-suppression element according to an embodiment of the invention.

FIG. 6B shows a simplified bottom view perspective of a showerhead 620 according to an embodiment of the invention. The showerhead 620 may correspond with the showerhead illustrated in FIG. 4. As described previously, the showerhead 620 may be positioned vertically adjacent to and above a gas reaction region. Similar to ion suppression plate 600, the showerhead 620 may be generally circular shaped and may include a plurality of first holes 622 and a plurality of second holes 624. The plurality of first holes 622 may allow plasma effluents to pass through the showerhead 620 into a gas reaction region, while the plurality of second holes 624 allow a precursor gas, such as a silicon precursor, etchants etc., to pass into the gas reaction region.

The plurality of first holes 622 may be through holes that extend from the top surface of the showerhead 620 through the showerhead. In one embodiment, each of the plurality of first holes 622 may have a smaller inner diameter (ID) toward the top surface of the showerhead 620 and a larger ID toward the bottom surface. In addition, the bottom edge of the plurality of first holes 622 may be chamfered 626 to help evenly distribute the plasma effluents in the gas reaction region as the plasma effluents exit the showerhead and thereby promote even mixing of the plasma effluents and precursor gases. The smaller ID of the first holes 622 may be between about 0.5 mm and about 20 mm. In one embodiment, the smaller ID may be between about 1 mm and 6 mm. The cross sectional shape of the first holes 622 may be generally cylindrical, conical, or any combination thereof. Further, the first holes 622 may be concentrically aligned with the through holes of passageways 602, when both an ion suppression element 600 and a showerhead 620 are used in a processing chamber. The concentric alignment may facilitate passage of an activated gas through both the ion suppression element 600 and showerhead 620 in the processing chamber.

In another embodiment, the plurality of first holes 622 may be through holes that extend from the top surface of the showerhead 620 through the showerhead, where each of the first holes 622 have a larger ID toward the top surface of the showerhead and a smaller ID toward the bottom surface of the showerhead. Further, the first holes 622 may include a taper region that transitions between the larger and smaller IDs. Such a configuration may prevent or regulate the passage of a plasma through the holes while permitting the passage of an activated gas. Such embodiments may be used in place of or in addition to ion suppression element 600. Exemplary embodiments of such through holes are provided in FIG. 7A.

The number of the plurality of first holes 622 may be between about 60 and about 2000. The plurality of first holes 622 may also have a variety of shapes, but are generally round. In embodiments where the processing chamber includes both a ion suppression plate 600 and a showerhead 620, the plurality of first holes 622 may be substantially aligned with the passageways 602 to facilitate passage of the plasma effluents through the ion suppression plate and showerhead.

The plurality of second holes 624 may extend from the bottom surface of the showerhead 620 partially through the showerhead. The plurality of second holes may be coupled with or connected to a plurality of channels (not shown) that deliver the precursor gas (e.g., deposition compounds, etchants, etc.) to the second holes 624 from an external gas source (not shown). The second holes may include a smaller ID at the bottom surface of the showerhead 620 and a larger ID in the interior of the showerhead. The number of second holes 624 may be between about 100 and about 5000 or between about 500 and about 2000 in different embodiments. The diameter of the second holes' smaller ID (i.e., the diameter of the hole at the bottom surface) may be between about 0.1 mm and about 2 mm. The second holes 624 are generally round and may likewise be cylindrical, conical, or any combination thereof. Both the first and second holes may be evenly distributed over the bottom surface of the showerhead 620 to promote even mixing of the plasma effluents and precursor gases.

With reference to FIG. 7A, exemplary configurations of the through holes are shown. The through holes depicted generally include a large inner diameter (ID) region toward an upper end of the hole and a smaller ID region toward the bottom or lower end of the hole. The smaller ID may be between about 0.2 mm and about 5 mm. Further, aspect ratios of the holes (i.e., the smaller ID to hole length) may be approximately 1 to 20. Such configurations may substantially block and/or control passage of ion species of the plasma effluent while allowing the passage of radical or neutral species. For example, varying the aspect ratio may regulate the amount of plasma that is allowed to pass through the through holes. Plasma passage may further be regulated by varying the pressure of the plasma within a region directly above the through holes.

Referring now to specific configurations, through hole 702 may include a large ID region 704 at an upper end of the hole and a small ID region 706 at a lower end of the hole with a stepped edge between the large and small IDs. Through hole 710 may include a large ID region 712 on an upper end and a large ID region 716 on a lower end of the hole with a small ID region 714 therebetween. The transition between the large and small ID regions may be stepped or blunt to provide an abrupt transition between the regions.

Through hole 720 may include a large ID region 722 at the upper end of the hole and small ID region 726 at a lower end of the hole with a tapered region 724 that transitions at an angle θ between the large and small regions. The height 728 of the small ID region 726 may depend on the overall height 727 of the hole, the angle θ of tapered region 724, the large ID, and the small ID. In one embodiment, the tapered region 724 comprises an angle of between about 15° and about 30°, and preferably about 22°; the overall height 727 is between about 4 mm and about 8 mm, and preferably about 6.35 mm; the large ID is between about 1 mm and about 4 mm, and preferably about 2.54 mm; the small ID is between about 0.2 mm and 1.2 mm, and preferably about 0.89 mm, so that the height 728 of the small ID region 726 region is between about 1 mm and about 3 mm, and preferably about 2.1 mm.

Through hole 730 may include a first ID region 732 at the upper end of the hole, a second ID region 734 concentrically aligned with and positioned vertically below first ID region 732, and a third ID region 736 concentrically aligned with and positioned vertically below second ID region 734. First ID region 732 may comprise a large ID, second ID region 734 may comprise a small ID, and third ID region 736 may comprise a slightly larger ID than second ID region 734. Third ID region 736 may extend to the lower end of the hole or may be outwardly tapered to an exit ID 737. The taper between the third ID region 736 and the exit ID 737 may taper at an angle $\theta_3$, which may be between about 15° and about 30°, and preferably about 22°. The second ID region 734 may include a chamfered edge that transitions from the first ID region 732 at an angle $\theta_1$, which may be between about 110° and about 140°. Similarly, the second ID region 734 may include a chamfered edge that transitions into the third ID region 736 at an angle $\theta_2$, which may also be between about 110° and about 140°. In one embodiment, the large ID of first region 732 may be between about 2.5 mm and about 7 mm, and preferably about 3.8 mm; the small ID of second ID region 734 may be between about 0.2 mm and about 5 mm, and preferably about 0.4 mm; the slightly larger ID of third ID region 736 may be between about 0.75 mm and about 2 mm, and preferably about 1.1 mm; and the exit ID may be between about 2.5 mm and about 5 mm, and preferably about 3.8 mm.

Figure 7B:
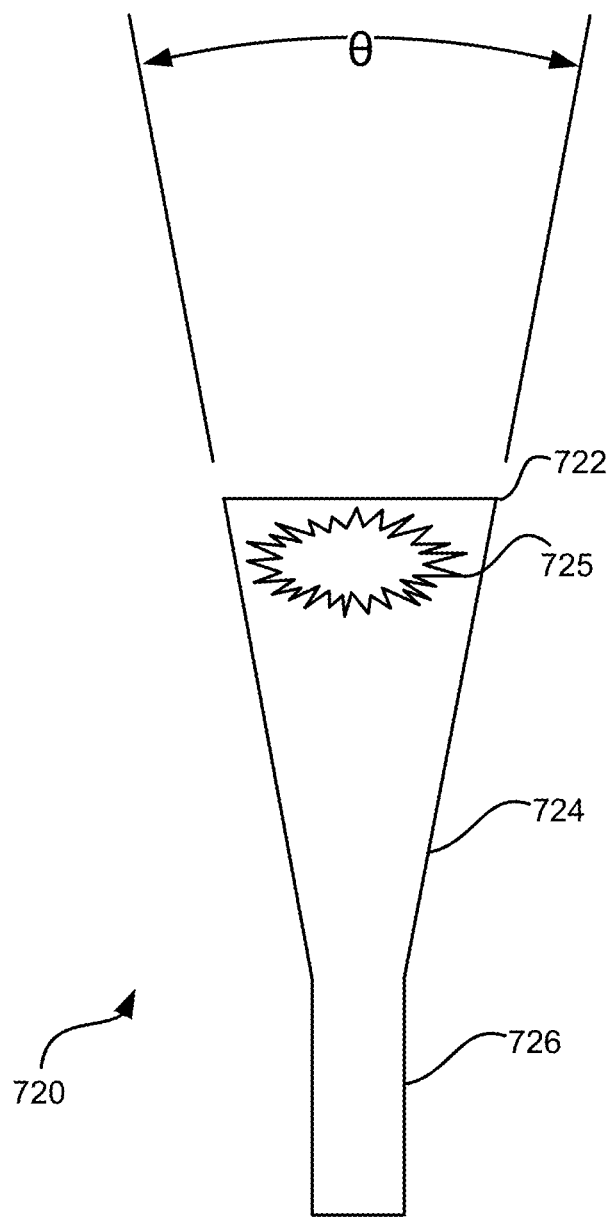
FIG. 7B shows a schematic of a hole geometry opening according to an embodiment of the invention.

The transition (blunt, stepped, tapered, etc.) between the large ID regions and small ID regions may substantially block the passage of ion species from passing through the holes while allowing the passage of radical or neutral species. For example, referring now to FIG. 7B, shown is an enlarged illustration of through hole 720 that includes the transition region 724 between the large ID region 722 and the small ID region 726. The tapered region 724 may substantially prevent plasma 725 from penetrating through the through hole 720. For example, as the plasma 725 penetrates into the through hole 720, the ion species may deactivate or ground out by contacting the walls of the tapered region 724, thereby limiting the passage of the plasma through the through hole and containing the plasma within the region above the through hole 720. The radical or neutral species, however, may pass through the through hole 720. Thus, the through hole 720 may filter the plasma 720 to prevent or control the passage of unwanted species. In an exemplary embodiment, the small ID region 726 of the through holes comprises an ID of 1 mm or smaller. To maintain a significant concentration of radical and/or neutral species penetrating through the through holes, the length of the small ID region and/or the taper angle may be controlled.

In addition to preventing the passage of plasma, the through holes described herein may be used to regulate the passage of plasma so that a desired level of plasma is allowed to pass through the through hole. Regulating the flow of plasma through the through holes may include increasing the pressure of the plasma in the gas region above the ion suppressor plate so that a desired fraction of the plasma is able to pass through the ion suppressor without deactivating or grounding out.

Figure 8:
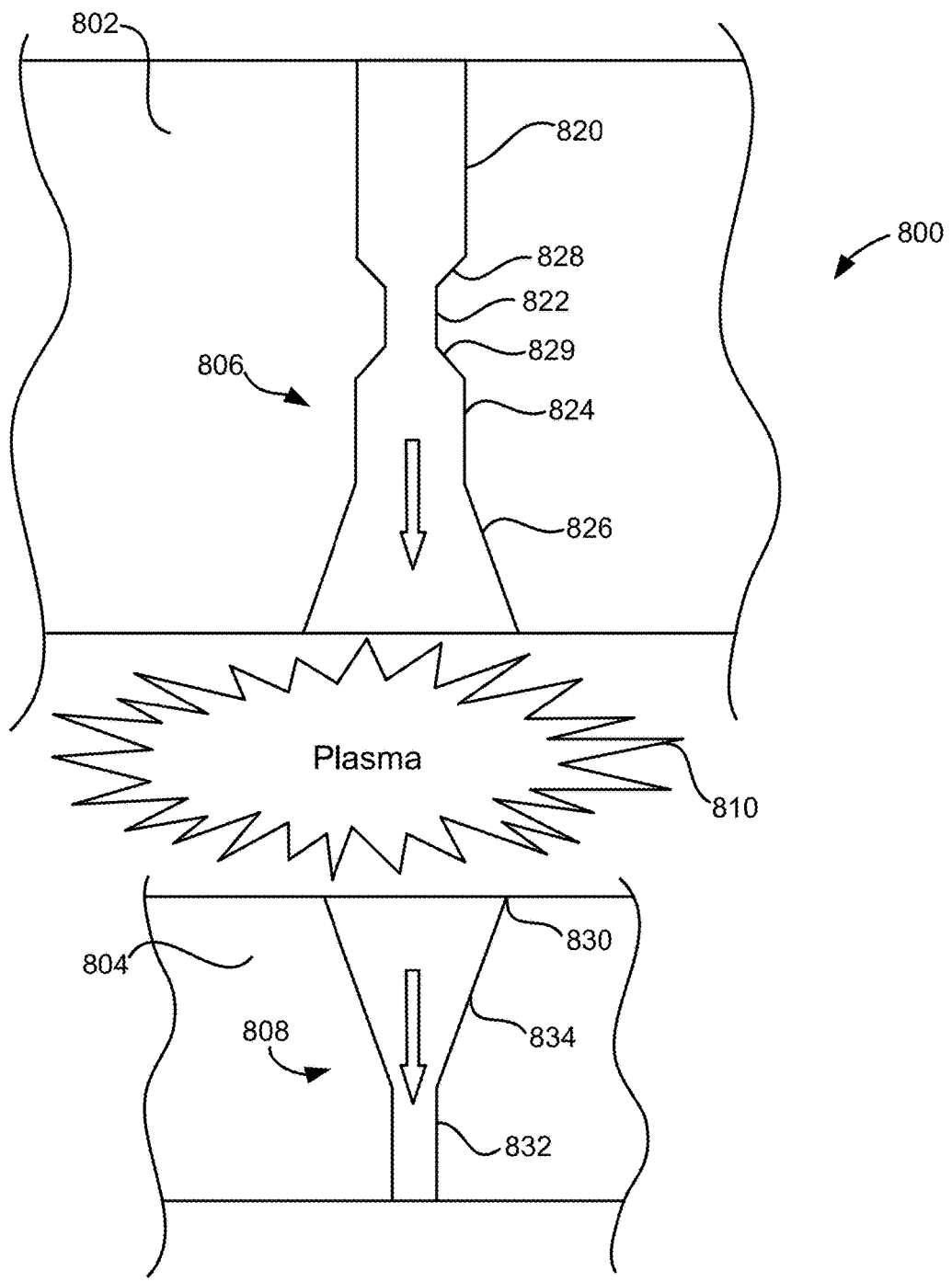
FIG. 8 shows an exemplary configuration of opposing openings in a pair of electrodes that help define a plasma region in a processing chamber according to an embodiment of the invention.

Referring now to FIG. 8, a simplified illustration of a CCP unit 800 is shown. Specifically, the CCP unit 800 shown includes a top plate 802 and a bottom plate 804 that define a plasma generation region 810 in which a plasma is contained. As previously described, the plasma may be generated by an RPS (not shown) and delivered to the plasma generation region 810 via through hole 806. Alternatively or additionally, the plasma may be generated in the CCP unit 800, for example, by utilizing top plate 802 and bottom plate 804 as first and second electrodes coupled to a power generation unit (not shown).

The top plate 802 may include a through hole 806 that allows process gas and/or plasma to be delivered into the plasma generation region 810 while preventing back-streaming of plasma through the top plate 802. The through hole 806 may be configured similar to through hole 730 having first, second, and third ID regions (820, 822, and 824 respectively), with a chamfered edge between adjacent regions (828 and 829) and a tapered region 826 transitioning between third ID region 824 and an exit ID. The tapered region 826 between third ID region 824 and the exit ID and/or the chamfered edge between second and third ID regions (822 and 824 respectively) may prevent back-streaming of plasma by deactivating or grounding ion species as the plasma penetrates into the through hole 806.

Similarly, the bottom plate 804 may include a through hole 808 that allows the radical or neutral species to pass through the through hole while preventing or controlling the passage of ion species. The through hole 808 may be configured similar to through hole 720 having a large ID region 830, a small ID region 832, and a tapered region 834 that transitions between the large ID region 830 and the small ID region 832. The tapered region 834 may prevent the flow of plasma through the through hole 808 by deactivating or grounding ion species as previously explained while allowing radical or neutral species to pass there through.

To further prevent passage of the plasma through the through holes, 806 and/or 808, the top plate 802 and/or bottom plate 804 may receive a charge to electrically bias the plasma and contain the plasma within plasma generation region 810 and/or adjust an ion concentration in the activated gas that passes through the bottom plate. Using top plate 802 and bottom plate 804 in CCP unit 800, the plasma may be substantially generated and/or maintained in the plasma generation region 810, while radical and neutral species are delivered to a gas reaction region to be mixed with one or more precursor gases to etch material from or deposit material on a substrate surface.

Exemplary Processes

In accordance with some embodiments of the invention, an ion suppressor as described above may be used to provide radical and/or neutral species for etch or deposition processes. In one embodiment, for example, an ion suppressor is used to provide fluorine radicals to selectively etch a metal-containing film. Using the fluorine radicals, an etch rate selectivity of the metal-containing film to a silicon oxide film of as high as about 80:1 or more can be obtained. Further, an etch rate selectivity of the metal-containing film to a silicon nitride film of as high as about 30:1 or more can be obtained. One use for such a process is to remove metal-containing films in three-dimensional device structures. Metal-containing films that may be etched in accordance with embodiments of the invention include, for example, tungsten films, hafnium films, zirconium films, tantalum films, titanium films, and the like, as well as silicates and oxides of these films.

The ion suppressor may be used to provide a reactive gas having a higher concentration of radicals than ions. Because most of the charged particles of a plasma are filtered or removed by the ion suppressor, the substrate is typically not biased during the etch process. Such a process using radicals and other neutral species can reduce plasma damage compared to conventional plasma etch processes that include sputtering and bombardment. Embodiments of the present invention are also advantageous over conventional wet etch processes where surface tension of liquids can cause bending and peeling of small features.

Figure 9:
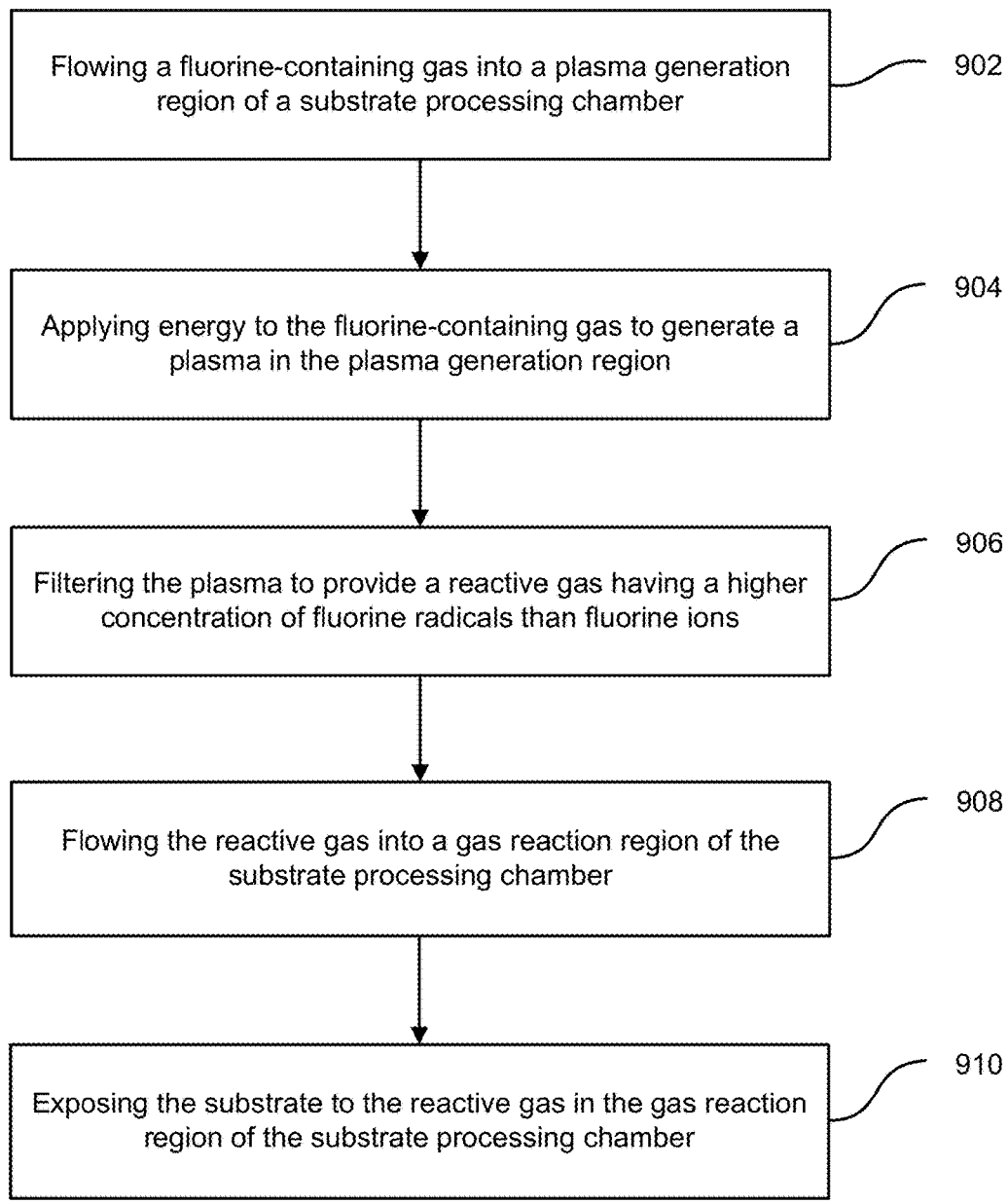
FIG. 9 is a simplified flowchart illustrating an exemplary method of selectively etching a metal-containing film from a substrate comprising a metal-containing layer and a silicon oxide layer according to an embodiment of the invention.

FIG. 9 is a simplified flowchart illustrating an exemplary method of selectively etching a metal-containing film from a substrate comprising a metal-containing layer and a silicon oxide layer and/or a silicon nitride layer according to an embodiment of the invention. The method includes flowing a fluorine-containing gas into a plasma generation region of a substrate processing chamber (902). The fluorine-containing gas may include HF, $F_2$, $NF_3$, $CF_4$, $CHF_3$, $C_2F_6$, $C_3F_6$, $BrF_3$, $ClF_3$, $SF_6$, or the like. Other embodiments may include other halogen containing gases, such as $Cl_2$, HBr, $SiCl_4$, or the link, in place of or in addition to the fluorine-containing gas. In the exemplary method of FIG. 9, the fluorine-containing gas may also include one or more oxygen sources such as $O_2$, $O_3$, $N_2O$, NO, or the like. Using oxygen can increase an etch rate of the metal-containing layer with minimal impact on an etch rate of the silicon oxide and/or silicon nitride. The fluorine-containing gas may also include one or more inert gases such as $H_2$, He, $N_2$, Ar, or the like. The inert gas can be used to improve plasma stability. Flow rates and ratios of the different gases may be used to control etch rates and etch selectivity. In an embodiment, the fluorine-containing gas includes $NF_3$ at a flow rate of between about 5 sccm and 500 sccm, $O_2$ at a flow rate of between about 0 sccm and 5000 sccm, and He at a flow rate of between about 0 sccm and 5000 sccm. One of ordinary skill in the art would recognize that other gases and/or flows may be used depending on a number of factors including processing chamber configuration, substrate size, geometry and layout of features being etched, and the like.

The method also includes applying energy to the fluorine-containing gas to generate a plasma in the plasma generation region (904). As would be appreciated by one of ordinary skill in the art, the plasma may include a number of charged and neutral species including radicals and ions. The plasma may be generated using known techniques (e.g., RF, capacitively coupled, inductively coupled, and the like). In an embodiment, the energy is applied using a CCP unit at a source power of between about 15 W and 5000 W and a pressure of between about 0.2 Torr and 30 Torr. The CCP unit may be disposed remote from a gas reaction region of the processing chamber. For example, the CCP unit and the plasma generation region may be separated from the gas reaction region by an ion suppressor.

The method also includes filtering the plasma to provide a reactive gas having a higher concentration of fluorine radicals than fluorine ions (906). The plasma may be filtered using an ion suppressor disposed between the plasma generation region and the gas reaction region of the substrate processing chamber. The ion suppressor may include a plurality of channels that allow passage of the fluorine radicals and neutral species between the plasma generation region and the gas reaction region. The ion suppressor may be configured to remove some or all of the ions passing from the plasma generation region. In an embodiment, for example, a significant portion of the ions may be removed such that the reactive gas is substantially free from ions.

The method also includes flowing the reactive gas into a gas reaction region of the substrate processing chamber (908). In an embodiment, the ion suppressor may be configured as a showerhead, and the reactive gas exiting the ion suppressor may flow into the gas reaction region proximate to the substrate. Alternatively, the reactive gas exiting the ion suppressor may flow through a showerhead or another gas distributor and into the gas reaction region.

The method also includes exposing the substrate to the reactive gas in the gas reaction region of the substrate processing chamber (910). In an embodiment, the temperature of the substrate may be between about −10° C. and 200° C., and the pressure in the substrate processing chamber may be between about 0.2 Torr and 30 Torr. One of ordinary skill in the art would recognize that other temperatures and/or pressures may be used depending on a number of factors as explained previously. The reactive gas etches the metal-containing layer at a higher etch rate than the reactive gas etches the silicon oxide layer and/or the silicon nitride layer.

Figure 10:
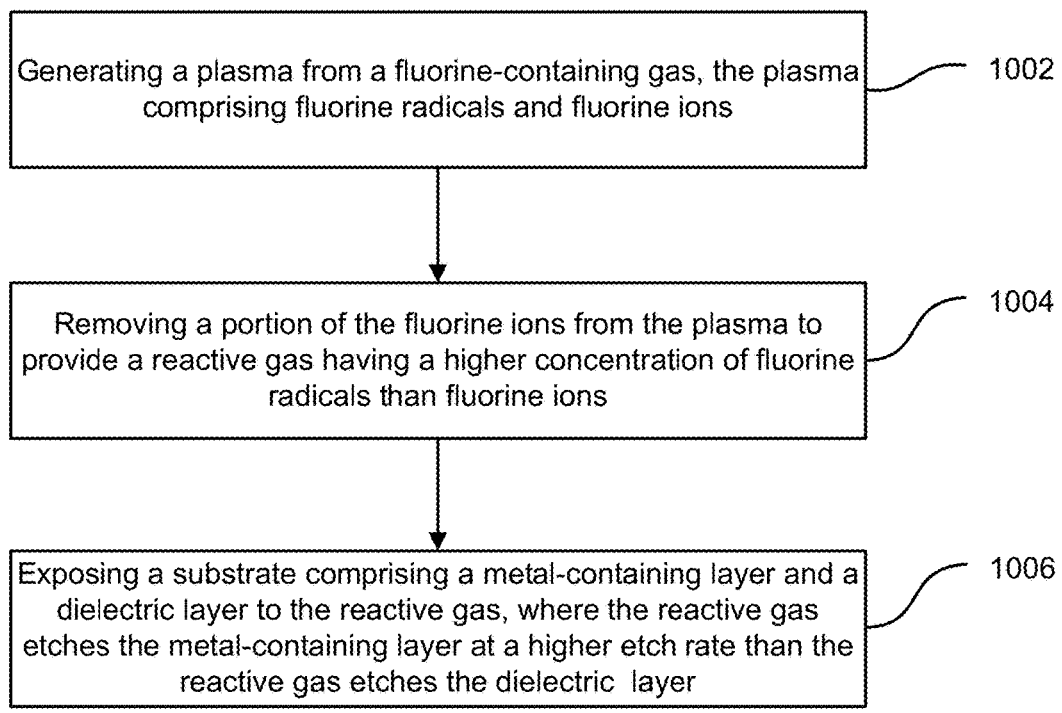
FIG. 10 is a simplified flowchart illustrating an exemplary etch process providing a higher etch rate of a metal-containing film than an etch rate of a dielectric film, such as a silicon oxide film and/or a silicon nitride film, according to an embodiment of the invention.

FIG. 10 is a simplified flowchart illustrating an exemplary etch process providing a higher etch rate of a metal-containing film than an etch rate of a dielectric film, such as a silicon oxide film and/or a silicon nitride film, according to an embodiment of the invention. The process includes generating a plasma from a fluorine-containing gas, the plasma comprising fluorine radicals and fluorine ions (1002). As explained above, the plasma may be formed in a plasma generation region of a substrate processing chamber that is separate from a gas reaction region. The process also includes removing a portion of the fluorine ions from the plasma to provide a reactive gas having a higher concentration of fluorine radicals than fluorine ions (1004). The portion of the fluorine ions may be removed using an ion suppressor. The process also includes exposing a substrate comprising a metal-containing layer and a dielectric layer to the reactive gas, where the reactive gas etches the metal-containing layer at a higher etch rate than the reactive gas etches the silicon oxide layer and/or the silicon nitride layer (1006).

It should be appreciated that the exemplary processes illustrated in FIGS. 9-10 are not limited to use with the processing chambers illustrated in FIG. 1-5 of the ion suppression elements illustrated in FIGS. 6A, 6B, 7A, 7B, and 8-9. Rather, processes in accordance with embodiments of the invention may be performed using other hardware configurations. Further, the specific steps illustrated in FIGS. 9-10 provide particular methods in accordance with embodiments of the present invention. The steps outlined above may be continuously repeated by system software, and other sequences of steps may be performed according to alternative embodiments. For example, the steps outlined above may be performed in a different order. Moreover, the individual steps illustrated in FIGS. 9-10 may include multiple sub-steps that may be performed in various sequences as appropriate to the individual step. Furthermore, additional steps may be added or removed depending on the particular application. One of ordinary skill in the art would recognize many variations, modifications, and alternatives.

It should be noted that the methods and apparatuses discussed throughout the specification are provided merely as examples. Various embodiments may omit, substitute, or add various steps or components as appropriate. For instance, it should be appreciated that features described with respect to certain embodiments may be combined in various other embodiments. Furthermore, embodiments may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may be adapted to perform the necessary tasks. The term "computer-readable medium" includes, but is not limited to, portable or fixed storage devices, optical storage devices, sim cards, other smart cards, and various other mediums capable of storing, containing, or carrying instructions or data.

What is claimed is:

1. A method of selectively etching a metal-containing film from a substrate comprising a metal-containing layer and a silicon oxide layer, the method comprising:

flowing a fluorine-containing gas into a plasma generation region of a substrate processing chamber, wherein the substrate processing chamber includes an ion suppressor plate, an annular component, and a showerhead, wherein the annular component is positioned between the ion suppressor plate and the showerhead to define a region between the ion suppressor plate and the showerhead;

applying energy to the fluorine-containing gas to generate plasma effluents in the plasma generation region, the plasma effluents comprising fluorine radicals and fluorine ions;

flowing the plasma effluents through the ion suppressor plate, which is configured to filter the plasma effluents into a reactive gas having a higher concentration of fluorine radicals than fluorine ions, wherein the ion suppressor plate comprises an electrode to form a plasma in the plasma generation region, and wherein the ion suppressor plate comprises a plate defining apertures through the ion suppressor plate;

subsequent to flowing the plasma effluents through the ion suppressor plate, flowing the plasma effluents through the region at least partially defined between the ion suppressor plate and the showerhead;

subsequent to flowing the plasma effluents through the region defined between the ion suppressor plate and the showerhead, flowing the plasma effluents through the showerhead, wherein the showerhead defines first channels through the showerhead configured to allow passage of the plasma effluents through the showerhead, wherein the showerhead defines second apertures separate from the first channels that are configured to allow a second precursor to flow into the processing region, and wherein the showerhead is configured to prevent the second precursor from mixing with the plasma effluents until each are flowed into the gas reaction region through the showerhead; and contacting the substrate with the reactive gas, wherein the reactive gas etches the metal-containing layer at a higher etch rate than the reactive gas etches the silicon oxide layer.

2. The method of claim 1 wherein the fluorine-containing gas comprises $NF_3$.

3. The method of claim 1 wherein the fluorine-containing gas comprises at least one of He or Ar.

4. The method of claim 1 wherein the metal-containing layer comprises tungsten.

5. The method of claim 1 wherein the metal-containing layer comprises tungsten oxide.

6. The method of claim 1 wherein the metal-containing layer comprises hafnium.

7. The method of claim 1 wherein the metal-containing layer comprises hafnium oxide.

8. The method of claim 1 wherein energy is applied to the fluorine-containing gas using a capacitively coupled plasma unit.

9. The method of claim 1 wherein the reactive gas is substantially free from fluorine ions.

10. The method of claim 1 wherein the ion suppressor comprises a plurality of channels that allow passage of fluorine radicals between the plasma generation region and the gas reaction region.

11. The method of claim 1 wherein the substrate is unbiased during etch of the metal-containing layer.

12. An etch process providing a higher etch rate of a metal-containing film than an etch rate of a dielectric film, the process comprising:
   generating a plasma from a fluorine-containing gas, the plasma comprising fluorine radicals and fluorine ions;
   flowing plasma effluents through an ion suppressor, wherein the ion suppressor is an electrode used to generate the plasma;
   removing a portion of the fluorine ions from the plasma effluents to provide a reactive gas having a higher concentration of fluorine radicals than fluorine ions;
   flowing the reactive gas through a showerhead into a processing region of the chamber, wherein the ion suppressor and the showerhead are separated from one another by an annular component positioned to define a region between the ion suppressor and the showerhead where the reactive gas resides subsequent to flowing through the ion suppressor and before flowing through the showerhead, wherein the showerhead defines first channels through the showerhead configured to allow passage of the plasma effluents through the showerhead, wherein the showerhead defines second apertures separate from the first channels that are configured to allow a second precursor to flow into the processing region, and wherein the showerhead is configured to prevent the second precursor from mixing with the plasma effluents until each are flowed into the gas reaction region; and
   exposing a substrate comprising a metal-containing layer and a dielectric layer to the reactive gas, wherein the reactive gas etches the metal-containing layer at a higher etch rate than the reactive gas etches the dielectric layer.

13. The etch process of claim 12 wherein the fluorine-containing gas comprises $NF_3$.

14. The etch process of claim 12 wherein the fluorine-containing gas comprises at least one of He or Ar.

15. The etch process of claim 12 wherein the metal-containing layer comprises tungsten.

16. The etch process of claim 12 wherein the metal-containing layer comprises hafnium.

17. The etch process of claim 12 the reactive gas is substantially free from fluorine ions.

18. The etch process of claim 12 wherein the ion suppressor comprises a plurality of channels that allow passage of fluorine radicals and suppression of fluorine ions.

19. The etch process of claim 12 wherein the dielectric layer comprises silicon oxide.

20. The etch process of claim 12 wherein the dielectric layer comprises silicon nitride.

* * * * *